United States Patent
Lee et al.

(10) Patent No.: US 8,471,602 B2
(45) Date of Patent: Jun. 25, 2013

(54) OUTPUT DRIVER AND SEMICONDUCTOR APPARATUS HAVING THE SAME

(75) Inventors: Jun Woo Lee, Icheon-si (KR); Dae Han Kwon, Icheon-si (KR); Taek Sang Song, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 133 days.

(21) Appl. No.: 12/983,164

(22) Filed: Dec. 31, 2010

(65) Prior Publication Data

US 2011/0267112 A1    Nov. 3, 2011

(30) Foreign Application Priority Data

Apr. 30, 2010 (KR) .................. 10-2010-0040609
Sep. 30, 2010 (KR) .................. 10-2010-0095629

(51) Int. Cl.
*H03B 1/00* (2006.01)
*H03K 3/00* (2006.01)

(52) U.S. Cl.
USPC .............. 327/108; 327/112; 326/82; 326/85

(58) Field of Classification Search
USPC ................................. 327/108, 112; 326/82, 85
See application file for complete search history.

(56) References Cited

U.S. PATENT DOCUMENTS

| | | | |
|---|---|---|---|
| 6,118,310 A | 9/2000 | Esch, Jr. | |
| 6,549,036 B1 | 4/2003 | Lee | |
| 7,317,337 B2 | 1/2008 | Na | |
| 7,339,409 B2 | 3/2008 | Choi et al. | |
| 2004/0083070 A1 | 4/2004 | Salmon et al. | |
| 2005/0127956 A1* | 6/2005 | Rho | 327/112 |
| 2006/0261844 A1 | 11/2006 | Kim et al. | |
| 2007/0008006 A1* | 1/2007 | Na | 326/83 |
| 2009/0059712 A1* | 3/2009 | Lee et al. | 365/230.06 |
| 2009/0167368 A1 | 7/2009 | Chan et al. | |
| 2010/0164544 A1* | 7/2010 | Song | 326/80 |

FOREIGN PATENT DOCUMENTS

| | | |
|---|---|---|
| JP | 2009-010921 | 1/2009 |
| KR | 1020040064757 A | 7/2004 |
| KR | 1020090126592 A | 12/2009 |

* cited by examiner

*Primary Examiner* — John Poos
(74) *Attorney, Agent, or Firm* — William Park & Associates Patent Ltd.

(57) ABSTRACT

An output driver includes: a pull-up signal generation unit configured to control a pulse width of first data and output a pull-up pre-drive signal; a pull-down signal generation unit configured to control a pulse width of second data and output a pull-down pre-drive signal; a pull-up pre-driver unit configured to receive the pull-up pre-drive signal and generate a pull-up main drive signal; a pull-down pre-driver unit configured to receive the pull-down pre-drive signal and generate a pull-down main drive signal; a pull-up main driver unit configured to charge an output node according to the pull-up main drive signal; and a pull-down main driver unit configured to discharge the output node according to the pull-down main drive signal.

16 Claims, 11 Drawing Sheets

OUTPUT DRIVER AND SEMICONDUCTOR APPARATUS HAVING THE SAME

CROSS-REFERENCES TO RELATED APPLICATION

The present application claims priority under 35 U.S.C. §119(a) to Korean application numbers 10-2010-0040609 and 10-2010-0095629, filed on Apr. 30, 2010 and Sep. 30, 2010, in the Korean Intellectual Property Office, which is incorporated herein by reference in its entirety.

BACKGROUND

1. Technical Field

The present invention relates to a semiconductor apparatus, and more particularly, to a semiconductor apparatus having an output driver.

2. Related Art

FIG. 1 is a circuit diagram of an output driver according to the conventional art. The conventional output driver includes a pull-up signal generation unit 10, a pull-down signal generation unit 20, a pull-up pre-driver unit 30, a pull-down pre-driver unit 40, a pull-up main driver unit 50a, and a pull-down main driver unit 60a.

The pull-up signal generation unit 10 may be configured to receive first data rdata and generate a pull-up pre-drive signal pup, and may include an inverter.

The pull-down signal generation unit 20 may be configured to receive second data fdata and generate a pull-down pre-drive signal pdn, and may include an inverter.

The pull-up pre-driver unit 30 is configured to receive the pull-up pre-drive signal pup and generate a pull-up main drive signal up. The pull-up main drive signal up generated by the pull-up pre-driver unit 30 is a signal which is controlled in slew rate and driving force to drive the pull-up main driver unit 50a. The pull-up pre-driver unit 30 may be configured to include an inverter which can change a driving force through a fuse option, etc.

The pull-down pre-driver unit 40 is configured to receive the pull-down pre-drive signal pdn and generate a pull-down main drive signal dn. The pull-down main drive signal dn generated by the pull-down pre-driver unit 40 is a signal which is controlled in slew rate and driving force to drive the pull-down main driver unit 60a. The pull-down pre-driver unit 40 may be configured to include an inverter which can change a driving force through a fuse option, etc.

The pull-up main driver unit 50a is configured to charge an output node no in response to the pull-up main drive signal up. The pull-up main driver unit 50a may be configured to include a PMOS transistor P.

The pull-down main driver unit 60a is configured to discharge the output node no in response to the pull-down main drive signal dn. The pull-down main driver unit 60a may be configured to include an NMOS transistor N.

The conventional output driver adopts a scheme of controlling slew rates of the pull-up main drive signal up and the pull-down main drive signal dn to control a slew rate of an output signal out. The slew rates of the pull-up main drive signal up and the pull-down main drive signal dn are controlled by configuring the pull-up pre-driver unit 30 and the pull-down pre-driver unit 40 to include the inverters which can change driving forces through fuse options, etc. By checking the slew rate of the output signal out and changing the driving forces of the pull-up pre-driver unit 30 and the pull-down pre-driver unit 40 depending upon a checking result, the slew rates of the pull-up and pull-down main drive signals up and dn can be controlled.

As stated above, the conventional scheme is to control the slew rates of the pull-up and pull-down main drive signals up and dn to control the slew rate of the output signal out. However, a disadvantage is that changes in the slew rates of the pull-up and pull-down main drive signals up and dn are greater than a change in the slew rate of the output signal out. This means that the changes should be made to sufficiently lengthen the rising times and the falling times of the pull-up and pull-down main drive signals up and dn so as to make a sufficient change in the slew rate of the output signal out.

In the extreme, there may be a case in which the pull-up and pull-down main drive signals up and dn do not make full swings from a power supply voltage level to a ground voltage level, and a jitter may be caused depending upon a data pattern, due to ISI (inter-symbol interference). This problem may lead to deterioration of a timing characteristic of the output signal out and occurrence of a skew between data pads DQs.

FIG. 2 is a block diagram of a semiconductor apparatus including an output driver according to the conventional art. The semiconductor apparatus shown in FIG. 2 includes a pull-up signal generation unit 10, a pull-down signal generation unit 20, a pull-up pre-driver unit 30, a pull-down pre-driver unit 40, a pull-up driver unit 50b, a pull-down driver unit 60b, a data determination unit 70, and an impedance calibration signal generation unit 80.

The semiconductor apparatus shown in FIG. 2 can output data by having a configuration similar to the conventional output driver shown in FIG. 1, and can perform an on-die termination operation by including the data determination unit 70 and the impedance calibration signal generation unit 80.

The pull-up signal generation unit 10 is configured to receive first data rdata and generate a pull-up pre-drive signal pup, and may include an inverter, like the pull-up signal generation unit 10 shown in FIG. 1.

The pull-down signal generation unit 20 is configured to receive second data fdata and generate a pull-down pre-drive signal pdn, and may include an inverter, like the pull-down signal generation unit 20 shown in FIG. 1.

The pull-up pre-driver unit 30 is configured to receive the pull-up pre-drive signal pup and generate a pull-up main drive signal up. The pull-up main drive signal up generated by the pull-up pre-driver unit 30 is a signal which is controlled in slew rate and driving force to drive the pull-up driver unit 50b. Like the pull-up pre-driver unit 30 shown in FIG. 1, the pull-up pre-driver unit 30 may be configured to include a plurality of inverters coupled in parallel and can change a driving force through fuse options, etc.

The pull-down pre-driver unit 40 is configured to receive the pull-down pre-drive signal pdn and generate a pull-down main drive signal dn. The pull-down main drive signal dn generated by the pull-down pre-driver unit 40 is a signal which is controlled in slew rate and driving force to drive the pull-down driver unit 60b. Like the pull-down pre-driver unit 40 shown in FIG. 1, the pull-down pre-driver unit 40 may be configured to include a plurality of inverters coupled in parallel and can change a driving force through fuse options, etc.

The pull-up driver unit 50b is configured to charge an output node no in response to the pull-up main drive signal up. The pull-up driver unit 50b is controlled in the driving force and the internal impedance value thereof in response to a first impedance calibration signal pcode.

The pull-down driver unit 60b is configured to discharge the output node no in response to the pull-down main drive signal dn. The pull-down driver unit 60b is controlled in the driving force and the internal impedance value thereof in response to a second impedance calibration signal ncode.

The data determination unit 70 is configured to generate the first data rdata and the second data fdata in response to an ODT enable signal odten, a first source signal RDO and a second source signal FDO. The data determination unit 70 and the ODT enable signal odten can control the first data rdata and the second data fdata such that the semiconductor apparatus shown in FIG. 2 can perform the on-die termination operation. The detailed configuration of the data determination unit 70 and the on-die termination operation according to the ODT enable signal odten will be described later with reference to FIG. 4.

The impedance calibration signal generation unit 80 is configured to check an impedance value of an external resistor Rz coupled to a ZQ pad and serving as a resistor element with a very small error, and generate the first impedance calibration signal pcode and the second impedance calibration signal ncode depending upon the checking result. The first impedance calibration signal pcode and the second impedance calibration signal ncode are signals which are respectively inputted to the pull-up driver unit 50b and the pull-down driver unit 60b and control driving forces and internal impedances of the pull-up driver unit 50b and the pull-down driver unit 60b.

Impedance calibration (ZQ calibration) indicates a procedure of generating pull-up and pull-down codes which are changed according to a process-voltage-temperature (PVT) variation. A resistance value of an on-die termination device (a termination resistance value of an output driver side or a termination resistance value of an input driver side in the case of a memory apparatus) is controlled using the pull-up and pull-down codes generated as a result of the impedance calibration, that is, the first and second impedance calibration signals pcode and ncode. The first and second impedance calibration signals pcode and ncode are signals which can have different number of bits depending upon a semiconductor apparatus.

In general, each of the first and second impedance calibration signals pcode and ncode comprises 3 to 6 bits in the case of a semiconductor memory apparatus (6 bits in the case of a DDR3 DRAM). For the sake of convenience in explanation, it will be exemplified in the present specification that each of the first and second impedance calibration signals pcode and ncode has 3 bits.

The conventional semiconductor apparatus shown in FIG. 2 operates in a data output mode or an on-die termination mode in response to the ODT enable signal odten. The data output mode is a mode in which the semiconductor apparatus performs an operation of outputting data, and the on-die termination mode is a mode in which the semiconductor apparatus simultaneously charge and discharge the output node no in such a way as to fix a voltage of the output node no in a high impedance (Hi-Z) state to a specified level and prevent occurrence of a far end reflection phenomenon in a signal when an input driver sharing a data pad DQ receives data through the data pad DQ.

If the ODT enable signal odten is deactivated, or deasserted, the semiconductor apparatus operates in the data output mode, and charges or discharges the output node no in response to the first source signal RDO and the second source signal FDO and outputs the output signal out through the data pad DQ. At this time, the data determination unit 70 generates the first source signal RDO and the second source signal FDO as the first data rdata and the second data fdata.

If the ODT enable signal odten is activated, or asserted, the semiconductor apparatus operates in the on-die termination mode, and simultaneously charges and discharges the output node no regardless of the first source signal RDO and the second source signal FDO. Accordingly, an on-die termination effect for the output node no is produced.

At this time, the data determination unit 70 sets and outputs the first data rdata and the second data fdata such that the pull-up driver unit 50b and the pull-down driver unit 60b can simultaneously charge and discharge the output node no. In order to maximize the on-die termination effect for the output node no, a pull-up current of the pull-up driver unit 50b and a pull-down current of the pull-down driver unit 60b should match each other. To this end, the pull-up driver unit 50b and the pull-down driver unit 60b receive the first impedance calibration signal pcode<0:2> and the second impedance calibration signal ncode<0:2> outputted from the impedance calibration signal generation unit 80 and are controlled such that their driving forces match each other.

FIG. 3 is a circuit diagram illustrating the pull-up driver unit 50b and the pull-down driver unit 60b shown in FIG. 2. The pull-up driver unit 50b is configured such that three PMOS transistor groups, each group comprising a pair of PMOS transistors coupled in series, are coupled in parallel. In the pull-up driver unit 50b shown in FIG. 3, three PMOS transistors 51, 53, and 55 are turned on in response to the pull-up main drive signal up. Three PMOS transistors 52, 54, and 56 are respectively coupled in series to the three PMOS transistors 51, 53, and 55, are turned on in response to respective bits of the first impedance calibration signal pcode<0:2>.

The three PMOS transistor groups, which are coupled in parallel, are coupled to the output node no through a resistor 57. The pull-up driver unit 50b configured as shown in FIG. 3 charges the output node no according to the pull-up main drive signal up, and the driving force of the pull-up driver unit 50b, that is, a charging current for the output node no is changed depending upon the first impedance calibration signal pcode<0:2>.

The pull-down driver unit 60b may be configured to include a plurality of NMOS transistors such that the pull-down driver unit 60b has a configuration similar to that of the pull-up driver unit 50b. The pull-down driver unit 60b is configured such that three NMOS transistor groups, each group comprising a pair of NMOS transistors coupled in series, are coupled in parallel. In the pull-down driver unit 60b shown in FIG. 3, three NMOS transistors 63, 65, and 67 are turned on in response to the pull-down main drive signal dn. Three NMOS transistors 62, 64, and 66, which are respectively coupled in series to the three NMOS transistors 63, 65, and 67, are turned on in response to respective bits of the second impedance calibration signal ncode <0:2>.

The three NMOS transistor groups, which are coupled in parallel, are coupled to the output node no through a resistor 61. The pull-down driver unit 60b configured as shown in FIG. 3 discharges the output node no according to the pull-down main drive signal dn, and the driving force of the pull-down driver unit 60b is changed depending upon the second impedance calibration signal ncode<0:2>.

In this way, the termination resistance values, that is, the driving forces of the pull-up driver unit 50b and the pull-down driver unit 60b, are controlled according to the first impedance calibration signal pcode<0:2> and the second impedance calibration signal ncode<0:2> in such a manner that the driving forces match each other.

FIG. 4 is a circuit diagram illustrating the data determination unit 70 shown in FIG. 2. The data determination unit 70 includes a first data generation section 71 and a second data generation section 72.

The first data generation section 71 includes a PMOS transistor 71-2 and an NMOS transistor 71-3 which are configured as an inverter and are turned on by the first source signal RDO. The PMOS transistor 71-2 is coupled in series with a PMOS transistor 71-1 which is coupled to a power supply voltage Vcc and is activated by the ODT enable signal odten such that a current path from the power supply voltage Vcc is formed through the PMOS transistor 71-1.

The NMOS transistor 71-3 is coupled in series with an NMOS transistor 71-4 which is coupled to a ground voltage Vss and is activated by an inverted signal odtenb of the ODT enable signal odten such that a current path to the ground voltage Vss is formed through the NMOS transistor 71-4. A PMOS transistor 71-5 is activated by the inverted signal odtenb of the ODT enable signal odten such that a current path is formed from the power supply voltage Vcc to a node nt to which the PMOS transistor 71-2 and the NMOS transistor 71-3 are commonly coupled.

An inverter 71-6 inverts a voltage of the node nt and outputs the first data rdata. If the ODT enable signal odten is deactivated to a low level, the PMOS transistor 71-5 is turned off and the PMOS transistor 71-1 and the NMOS transistor 71-4 are turned on such that the PMOS transistor 71-2 and the NMOS transistor 71-3 perform an inverter operation for the first source signal RDO. Accordingly, if the ODT enable signal odten is deactivated to the low level, the first data generation section 71 outputs the first source signal RDO as the first data rdata.

Conversely, if the ODT enable signal odten is activated to a high level, the PMOS transistor 71-5 is turned on and the PMOS transistor 71-1 and the NMOS transistor 71-4 are turned off such that the PMOS transistor 71-2 and the NMOS transistor 71-3 cannot form a current path to the node nt. A charging operation from the power supply voltage Vcc to the node nt is performed through the PMOS transistor 71-5. Accordingly, if the ODT enable signal odten is activated to the high level, the first data generation section 71 outputs the first data rdata to a low level.

If the ODT enable signal odten is deactivated to the low level, the second data generation section 72 outputs the second source signal FDO as the second data fdata, and if the ODT enable signal odten is activated to the high level, the second data generation section 72 outputs the second data fdata to a high level. Since the second data generation section 72 may be configured similarly to the first data generation section 71 shown in FIG. 4, detailed description thereof will be omitted herein.

In the data output mode, if the ODT enable signal odten is deactivated to the low level, the first source signal RDO is outputted as the first data rdata as described above, and the second source signal FDO is outputted as the second data fdata. Accordingly, the pull-up signal generation unit 10, the pull-down signal generation unit 20, the pull-up pre-driver unit 30, and the pull-down pre-driver unit 40 shown in FIG. 2 generate the pull-up main drive signal up by controlling the driving force of the first data rdata and generate the pull-down main drive signal dn by controlling the driving force of the second data fdata.

Further, the pull-up driver unit 50b or the pull-down driver unit 60b shown in FIG. 3 charges or discharges the output node no in response to the pull-up main drive signal up or the pull-down main drive signal dn. The driving forces of the pull-up driver unit 50b and the pull-down driver unit 60b shown in FIG. 3 are changed by virtue of the PMOS transistors 52, 54 and 56 and the NMOS transistors 62, 64 and 66 which are turned on, respectively, in response to the first impedance calibration signal pcode<0:2> and the second impedance calibration signal ncode<0:2>. The charging and discharging operations for the output node no are alternately performed.

Therefore, while the pull-up driver unit 50b is activated in response to the pull-up main drive signal up and charges the output node no, the pull-down driver unit 60b is deactivated in response to the pull-down main drive signal dn and does not discharge the output node no. Conversely, while the pull-down driver unit 60b is activated in response to the pull-down main drive signal dn and discharges the output node no, the pull-up driver unit 50b is deactivated in response to the pull-up main drive signal up and does not charge the output node no.

In the on-die termination mode, if the ODT enable signal odten is activated to the high level, the first data rdata is outputted to the low level and the second data fdata is outputted to the high level as described above. Accordingly, the pull-up signal generation unit 10, the pull-down signal generation unit 20, the pull-up pre-driver unit 30, and the pull-down pre-driver unit 40 shown in FIG. 2 generate the pull-up main drive signal up to the low level and the pull-down main drive signal dn to the high level.

Accordingly, the PMOS transistors 51, 53, and 55 and the NMOS transistors 63, 65, and 67 of the pull-up driver unit 50b and the pull-down driver unit 60b shown in FIG. 3 are turned on. Therefore, the pull-up driver unit 50b and the pull-down driver unit 60b shown in FIG. 3 are changed in driving forces by virtue of the PMOS transistors 52, 54 and 56 and the NMOS transistors 62, 64 and 66 which are turned on, respectively, according to the first impedance calibration signal pcode<0:2> and the second impedance calibration signal ncode<0:2>, and simultaneously charge and discharge the output node no, thereby performing the on-die termination operation. In general, such an on-die termination operation is performed while the input driver sharing the DQ pad receives data.

The conventional semiconductor apparatus shown in FIGS. 2 through 4 adopts the scheme of controlling the slew rates of the pull-up and pull-down main drive signals up and dn so as to control the slew rate of the output signal out in the data output mode, similarly to the conventional output driver shown in FIG. 1. The slew rates of the pull-up and pull-down main drive signals up and dn are controlled by configuring the pull-up pre-driver unit 30 and the pull-down pre-driver unit 40 to include a plurality of inverters coupled in parallel and which can change driving forces through fuse options, etc.

In the conventional semiconductor apparatus, by checking the slew rate of the output signal out and controlling the driving forces of the pull-up pre-driver unit 30 and the pull-down pre-driver unit 40 through fuse cutting, etc. according to a checking result, the slew rates of the pull-up and pull-down main drive signals up and dn are controlled.

The plurality of inverters for constituting the pull-up pre-driver unit 30 and the pull-down pre-driver unit 40 include a plurality of transistors for performing a pull-up operation and a plurality of transistors for performing a pull-down operation. According to this fact, in the conventional semiconductor apparatus, the slew rate characteristic of the output signal out is markedly changed depending upon the characteristics of the plurality of transistors for performing the pull-up operation and the plurality of transistors for performing the pull-down operation which constitute the pull-up pre-driver unit and the pull-down pre-driver unit 40. The conventional semiconductor apparatus has a disadvantage in that characteristics markedly change depending upon a PVT variation (process, voltage, temperature variation).

Also, in the case where the pull-up pre-driver unit 30 and the pull-down pre-driver unit 40 are configured to include the plurality of inverters coupled in parallel and which can change driving forces through fuse options, etc., since the fuse options are component elements which occupy a relatively large area, integration of the semiconductor apparatus may be adversely influenced.

Further, in the conventional semiconductor apparatus, a disadvantage is caused in that degrees to which the slew rates of the pull-up and pull-down main drive signals up and do should be changed to control the slew rate of the output signal out in the data output mode are greater than a degree to which the slew rate of the output signal out to be controlled should be changed.

This means that rising times and falling times of the pull-up and pull-down main drive signals up and dn should be changed to be sufficiently lengthened so as to calibrate the slew rate of the output signal out in conformity with a PVT variation. In the extreme, there may be a case in which the pull-up and pull-down main drive signals up and dn do not make full swings from a power supply voltage level to a ground voltage level, and a jitter may be caused depending upon a data pattern, due to ISI (inter-symbol interference). This problem may lead to the deterioration of a timing characteristic of the output signal and the occurrence of a skew between data pads DQs.

SUMMARY

In one embodiment of the present invention, an output driver includes: a pull-up signal generation unit configured to control a pulse width of first data and output a pull-up pre-drive signal; a pull-down signal generation unit configured to control a pulse width of second data and output a pull-down pre-drive signal; a pull-up pre-driver unit configured to receive the pull-up pre-drive signal and generate a pull-up main drive signal; a pull-down pre-driver unit configured to receive the pull-down pre-drive signal and generate a pull-down main drive signal; a pull-up main driver unit configured to charge an output node according to the pull-up main drive signal; and a pull-down main driver unit configured to discharge the output node according to the pull-down main drive signal.

In another embodiment of the present invention, a semiconductor apparatus includes: a pulse width control block configured to control a pulse width of first data and output a pull-up pre-drive signal and to control a pulse width of second data and output a pull-down pre-drive signal, according to a first impedance calibration signal and a second impedance calibration signal; and a driver block configured to drive an output node in response to the pull-up pre-drive signal and the pull-down pre-drive signal. The driver block may simultaneously charge and discharge the output node for a predetermined time in a data output mode.

BRIEF DESCRIPTION OF THE DRAWINGS

Features, aspects, and embodiments are described in conjunction with the attached drawings, in which.

DETAILED DESCRIPTION

Hereinafter, an output driver and a semiconductor apparatus having the same according to various embodiments of the present invention will be described below with reference to the accompanying drawings.

Figure 1:
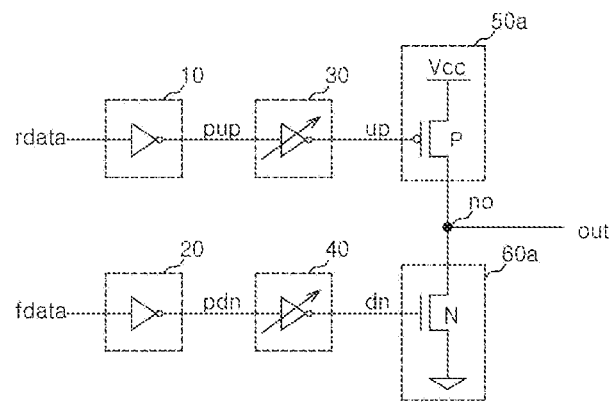
FIG. 1 is a circuit diagram of an output driver according to the conventional art.
Figure 2:
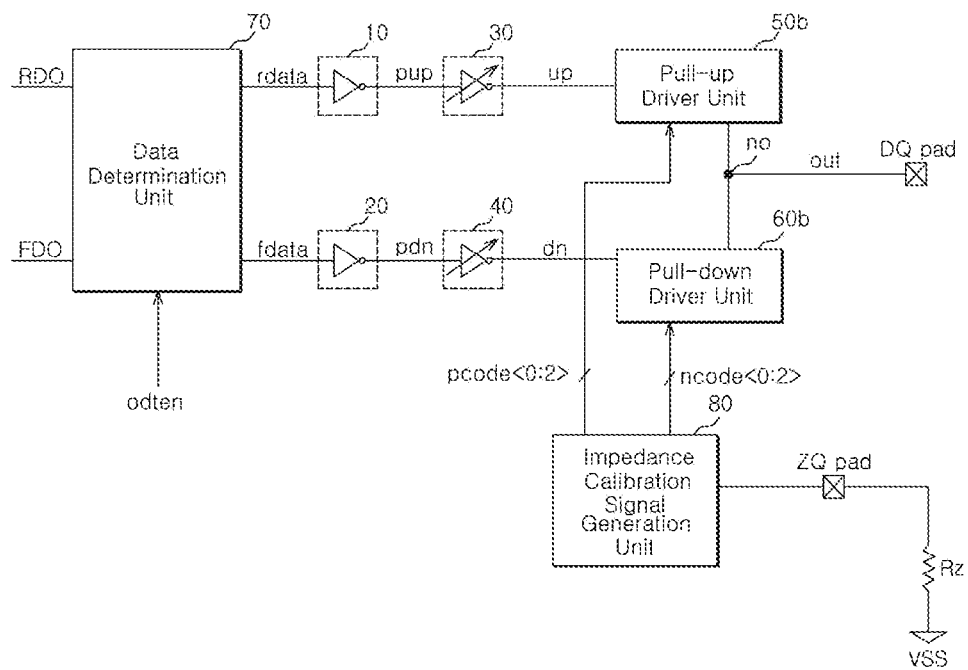
FIG. 2 is a block diagram of a semiconductor apparatus including an output driver according to the conventional art.

The conventional output drivers shown in FIGS. 1 and 2 are configured to control slew rates of a pull-up main drive signal up and a pull-down main drive signal dn through controlling driving forces of a pull-up pre-driver unit 30 and a pull-down pre-driver unit 40, and control a slew rate of an output signal out in a normal output mode through controlling the slew rates of the pull-up main drive signal up and the pull-down main drive signal dn.

Accordingly, slew rate of the conventional output driver is sensitive to PVT variation, and as the slew rates of the pull-up main drive signal up and the pull-down main drive signal dn decrease, a jitter may be caused due to ISI (inter-symbol interference). An output driver in accordance with an embodiment of the present invention may be configured to control pulse widths of a pull-up main drive signal up and a pull-down main drive signal dn through controlling pulse widths of a pull-up pre-drive signal pup and a pull-down pre-drive signal pdn, and thereby control slew rate of an output signal out in a normal output mode by controlling the pulse widths of the pull-up main drive signal up and the pull-down main drive signal dn.

Also, the output driver in accordance with another embodiment of the present invention may be configured to control pulse widths in response to impedance calibration signals outputted from an impedance (ZQ) calibration circuit. Accordingly, in the output drivers in accordance with the embodiments of the present invention, since a change in a slew rate characteristic due to PVT variation can be compensated for, slew rate insensitive to PVT variation can be realized, and occurrence of a jitter due to ISI can be prevented.

Figure 5:
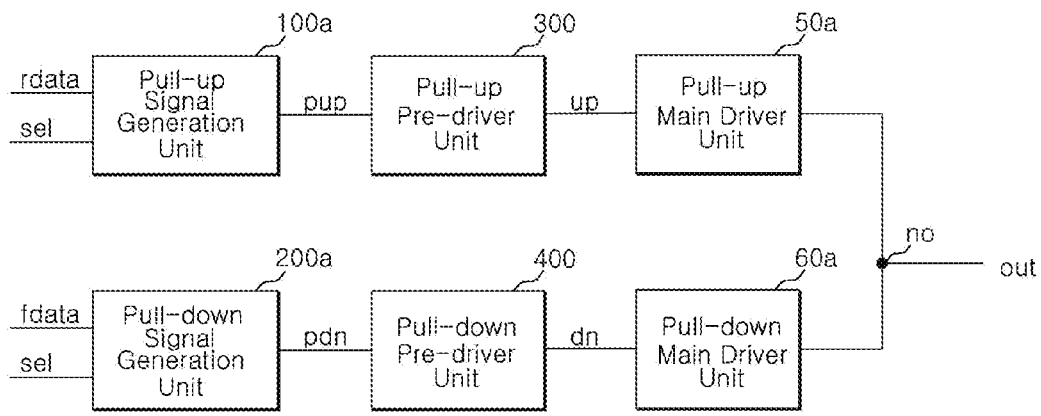
FIG. 5 is a block diagram illustrating the configuration of an output driver in accordance with an embodiment of the present invention.

FIG. 5 is a block diagram illustrating the configuration of an output driver in accordance with an embodiment of the present invention. The output driver may be configured to include a pull-up signal generation unit 100a, a pull-down signal generation unit 200a, a pull-up pre-driver unit 300, a pull-down pre-driver unit 400, a pull-up main driver unit 50a, and a pull-down main driver unit 60a.

The pull-up signal generation unit 100a is configured to control a pulse width of first data rdata according to a select signal sel and output a pull-up pre-drive signal pup.

The pull-down signal generation unit 200a is configured to control a pulse width of second data fdata according to the select signal sel and output a pull-down pre-drive signal pdn.

The pull-up pre-driver unit 300 is configured to receive the pull-up pre-drive signal pup and generate a pull-up main drive signal up.

The pull-down pre-driver unit 400 is configured to receive the pull-down pre-drive signal pdn and generate a pull-down main drive signal dn.

The pull-up main driver unit 50a is configured to charge an output node no according to the pull-up main drive signal up.

The pull-down main driver unit 60a is configured to discharge the output node no according to the pull-down main drive signal dn.

In the conventional output driver, when charging or discharging the output node no through the pull-up main driver unit 50a and the pull-down main driver unit 60a, the pull-up main driver unit 50a and the pull-down main driver unit 60a are alternately activated. During a period in which the pull-up main driver unit 50a is activated and charges the output node no, the pull-down main driver unit 60a is deactivated and does not discharge the output node no.

Conversely, during a period in which the pull-down main driver unit 60a is activated and discharges the output node no, the pull-up main driver unit 50a is deactivated and does not charge the output node no. However, the output driver in accordance with an embodiment of the present invention not only has a period in which one of a charging operation and a discharging operation is performed for the output node no, but additionally has a period in which both the charging operation and the discharging operation are simultaneously performed for the output node no.

The simultaneous performance of the charging operation and the discharging operation for the output node no is implemented by controlling the pulse widths of the first data rdata and the second data fdata and generating the pull-up pre-drive signal pup and the pull-down pre-drive signal pdn. The output driver according to an embodiment of the present invention can control a slew rate by having a period in which the charging operation and the discharging operation are simultaneously performed for the output node no.

Assuming that the slew rate when only performing the charging operation for the output node no during a first period is 'a' and the slew rate when simultaneously performing the charging and discharging operations for the output node no during a portion of the first period and performing only the charging operation for the output node no for the remaining portion of the first period is 'b', an absolute value of 'a' is greater than an absolute value of 'b'. Further, as a rate increases in the portion of the first period in which charging and discharging operations for the output node no are simultaneously performed, a difference between the absolute value of 'a' and the absolute value of 'b' becomes great.

In data output mode, the first data rdata and the second data fdata are signals which have the same voltage level and the same timing. In the case of the conventional output driver, the same signal value is inputted as the first data rdata and the second data fdata, and, therefore, the pull-up pre-drive signal pup and the pull-down pre-drive signal pdn, which are generated according to the first data rdata and the second data fdata, have the same signal value.

The pull-up main drive signal up and the pull-down main drive signal do also have the same signal value. Because the pull-up main driver unit 50a shown in FIG. 1 is configured to include a PMOS transistor and the pull-down main driver unit 60a shown in FIG. 1 is configured to include an NMOS transistor, the pull-up main driver unit 50a and the pull-down main driver unit 60a, which are activated by receiving the pull-up main drive signal up and the pull-down main drive signal dn having the same signal value, are activated alternately with each other.

That is to say, the pull-up main drive signal up and the pull-down main drive signal dn are not simultaneously activated. However, in the output driver in accordance with the embodiment of the present invention, due to the fact that the pull-up pre-drive signal pup and the pull-down pre-drive signal pdn are generated by controlling the pulse widths of the first data rdata and the second data fdata, the output driver can have a period in which the pull-up main driver unit 50a and the pull-down main driver unit 60a simultaneously charge and discharge the output node no. The control of the pulse widths of the first data rdata and the second data fdata is implemented according to the select signal sel. A difference in the pulse widths of the pull-up pre-drive signal pup and the pull-down pre-drive signal pdn is changed according to the select signal sel, and accordingly, slew rate of an output signal out is changed as well. A test mode signal may be used as the select signal sel.

The configuration of the output driver in accordance with an embodiment of the present invention that the slew rate of the output signal out is controlled by generating the pull-up pre-drive signal pup and the pull-down pre-drive signal pdn through controlling the pulse widths of the first data rdata and the second data fdata can solve the problems caused in the conventional output driver.

In the conventional art shown in FIG. 1, due to the fact that the slew rates of the pull-up main drive signal up and the pull-down main drive signal dn are controlled to control the slew rate of the output signal out, problems are caused in that, since the slew rates of the pull-up and pull-down main drive signals up and dn are excessively small, the pull-up and pull-down main drive signals up and dn may not make full swings from a power supply voltage level to a ground voltage level, and accordingly, a jitter may be caused due to ISI, which may lead to deterioration of a timing characteristic of the output signal out and occurrence of a skew between data pads DQs.

These problems of the conventional art can be solved according to an embodiment of the present invention due to the fact that the slew rate of the output signal out is controlled by controlling the pulse widths of the first data rdata and the second data fdata. This is because the slew rates of the pull-up main drive signal up and the pull-down main drive signal dn, generated according to an embodiment of the present invention, need not be changed to control the slew rate of the output signal out.

Figure 6:
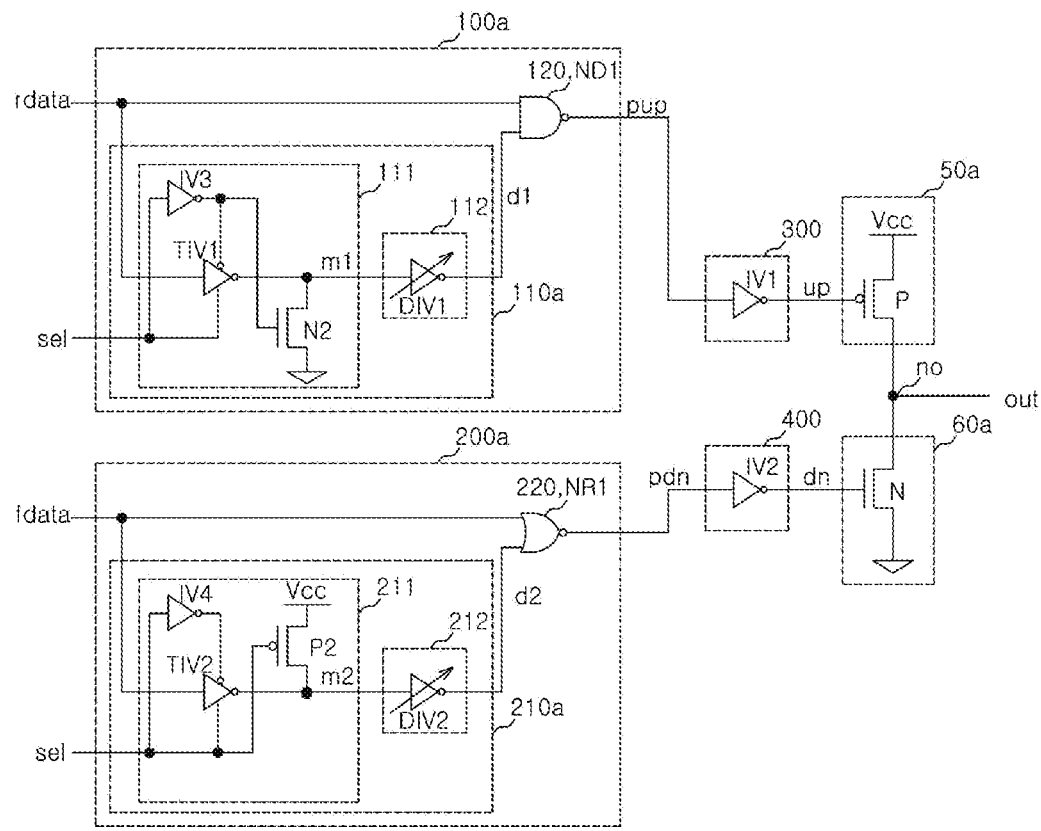
FIG. 6 is a circuit diagram illustrating one embodiment of the output driver shown in FIG. 5.

FIG. 6 is a circuit diagram illustrating one embodiment of the output driver shown in FIG. 5.

Like the output driver shown in FIG. 5, the output driver shown in FIG. 6 includes a pull-up signal generation unit 100a, a pull-down signal generation unit 200a, a pull-up pre-driver unit 300, a pull-down pre-driver unit 400, a pull-up main driver unit 50a, and a pull-down main driver unit 60a.

The pull-up main driver unit 50a may be configured like the pull-up main driver unit 50a in FIG. 1. Also, the pull-down main driver unit 60a may be configured like the pull-down main driver unit 60a in FIG. 1.

The pull-up pre-driver unit 300 may be configured to include a first inverter IV1. The first inverter IV1 is an inverter which has a constant driving force. Unlike the pull-up pre-driver unit 30 according to the conventional art, the pull-up pre-driver unit 300 need not include an inverter which can change a driving force through a fuse option, etc. This is because, as described above, in the output driver according to an embodiment of the present invention, a pulse width of an output signal out is controlled by generating a pull-up pre-drive signal pup and a pull-down pre-drive signal pdn through controlling pulse widths of first data rdata and second data fdata in the pull-up signal generation unit 100a and the pull-down signal generation unit 200a, respectively.

However, when the pull-up pre-driver unit 300 is configured to include an element capable of controlling a driving force (for example, an inverter capable of changing a driving force through a fuse option), the pulse width of the output signal out can be controlled in a precise manner. Accordingly, it is to be understood that the invention need not be limited to the configurations shown in FIG. 6 of the pull-up pre-driver unit 300 and the pull-down pre-driver unit 400 using inverters with constant driving forces.

The pull-down pre-driver unit 400 is configured in the same manner as the pull-up pre-driver unit 300, and may be configured to include a second inverter IV2. Accordingly, detailed descriptions of the pull-down pre-driver unit 400 will be omitted herein.

The pull-up signal generation unit 100a shown in FIG. 6 is configured to control the pulse width of the first data rdata and to output the pull-up pre-drive signal pup when a select signal sel is activated. When the select signal sel is deactivated, the pulse width of the first data rdata is not modified and the first data rdata is output as the pull-up pre-drive signal pup.

The pull-up signal generation unit 100a includes a first delayed signal generation section 110a and a first pulse control section 120.

The first delayed signal generation section 110a is configured to delay the first data rdata and output a first delayed signal d1 when the select signal sel is activated and to output the first delayed signal d1 set to a specified voltage level when the select signal sel is deactivated.

The first pulse control section 120 is configured to receive the first data rdata and the first delayed signal d1, and output the first data rdata as the pull-up pre-drive signal pup without controlling the pulse width of the first data rdata when the first delayed signal d1 has the specified voltage level and output the first data rdata as the pull-up pre-drive signal pup by controlling the pulse width of the first data rdata when the first delayed signal d1 does not have the specified voltage level. A degree to which the pulse width of the first data rdata is controlled is changed depends upon a time by which the first delayed signal d1 is delayed with respect to the first data rdata.

The first delayed signal generation section 110a includes a first mode selection stage 111 and a first delay stage 112. The first mode selection stage 111 is configured to output the first data rdata as a first mode signal m1 when the select signal sel is activated and to output the first mode signal m1 set to the specified voltage level when the select signal sel is deactivated. The first delay stage 112 is configured to delay the first mode signal m1 and output the first delayed signal d1.

When the select signal sel is activated, the first mode selection stage 111 outputs the first data rdata as the first mode signal m1, and the first delay stage 112 outputs the first delayed signal d1 by delaying the first mode signal m1. Therefore, when the select signal sel is activated, the first delayed signal d1 corresponds to a signal which is generated by delaying the first data rdata. When the select signal sel is deactivated, the first mode selection stage 111 outputs the first mode signal m1 set to the specified voltage level, and the first delay stage 112 outputs the first delayed signal d1 by delaying the first mode signal m1. Therefore, when the select signal sel is deactivated, the first delayed signal d1 has the specified voltage level.

The first mode selection stage 111 may be configured to include a first tri-state inverter TIV1, a third inverter IV3, and a fixed NMOS transistor N2. The third inverter IV3 inverts and then outputs the select signal sel. The first tri-state inverter TIV1 receives the first data rdata through an input terminal, the select signal sel through an NMOS input terminal, and the inverted signal of the select signal sel through a PMOS input terminal.

The fixed NMOS transistor N2 is coupled between an output terminal of the first tri-state inverter TIV1 and a ground voltage, and receives an inverted value of the select signal sel. In the first mode selection stage 111, if the select signal sel is activated to a high level, the first tri-state inverter TIV1 is activated and the fixed NMOS transistor N2 is turned off, the first data rdata is inverted and then outputted as the first mode signal m1. If the select signal sel is deactivated to a low level, the first tri-state inverter TIV1 is deactivated and the fixed NMOS transistor N2 is turned on, the first mode signal m1 is outputted by being set to a high level.

As described above, the first delay stage 112 delays the first mode signal m1 and outputs the first delayed signal d1. The first delay stage 112 may be configured by a delay inverter DIV1 which is generally known in the art. Since a degree of the change in the pulse width of the pull-up drive signal pup is determined depending upon a delay time of the first delay stage 112, the first delay stage 112 may be designed to delay the first mode signal m1 by a predetermined time or to variably delay the first mode signal m1 through a fuse option, etc.

The first pulse control stage 120 may be configured to include a combinational NAND gate ND1. The combinational NAND gate ND1 receives and NANDs the first data rdata and the first delayed signal d1 and generates the pull-up pre-drive signal pup. Due to a characteristic of a NANDing operation, if the first delayed signal d1 has a high level, the combinational NAND gate ND1 inverts the first data rdata.

Accordingly, when the first delayed signal d1 has the high level, the first pulse control stage 120 outputs the pull-up pre-drive signal pup without controlling the pulse width of the first data rdata. If the select signal sel is at a low level and the delayed signal of the first data rdata is inputted to the combinational NAND gate ND1 as the first delayed signal d1, the combinational NAND gate ND1 generates the pull-up pre-drive signal pup through the NANDing operation in a form in which a high level pulse width of the first data rdata is narrowed. At this time, the pulse width is changed depending upon a time for which the first delayed signal d1 is delayed compared to the first data rdata.

The pull-down signal generation unit 200a shown in FIG. 6 is configured to control the pulse width of the second data fdata and to output the pull-down pre-drive signal pdn when the select signal sel is activated, and not to control the pulse width of the second data fdata and output the pull-down pre-drive signal pdn when the select signal sel is deactivated.

The pull-down signal generation unit 200a includes a second delayed signal generation section 210a and a second pulse control section 220.

The second delayed signal generation section 210a is configured to delay the second data fdata and output a second delayed signal d2 when the select signal sel is activated and to output the second delayed signal d2 set to a specified voltage level when the select signal sel is deactivated.

The second pulse control section 220 is configured to receive the second data fdata and the second delayed signal d2, and output the second data fdata as the pull-down pre-drive signal pdn without controlling the pulse width of the second data fdata when the second delayed signal d2 has the specified voltage level and output the second data fdata as the pull-down pre-drive signal pdn by controlling the pulse width of the second data fdata when the second delayed signal d2 does not have the specified voltage level. A degree to which the pulse width of the second data fdata is controlled is changed depending upon a time by which the second delayed signal d2 is delayed with respect to the second data fdata.

The second delayed signal generation section 210a includes a second mode selection stage 211 and a second delay stage 212. The second mode selection stage 211 is configured to output the second data fdata as a second mode signal m2 when the select signal sel is activated and to output the second mode signal m2 set to the specified voltage level when the select signal sel is deactivated. The second delay stage 212 is configured to delay the second mode signal m2 and output the second delayed signal d2. When the select signal sel is activated, the second mode selection stage 211 outputs the second data fdata as the second mode signal m2, and the second delay stage 212 outputs the second delayed signal d2 by delaying the second mode signal m2.

Therefore, when the select signal sel is activated, the second delayed signal d2 corresponds to a signal which is generated by delaying the second data fdata. Also, when the select signal sel is deactivated, the second mode selection stage 211 outputs the second mode signal m2 set to the specified voltage level, and the second delay stage 212 outputs the second delayed signal d2 by delaying the second mode signal m2. Therefore, when the select signal sel is deactivated, the second delayed signal d2 has the specified voltage level.

The second mode selection stage 211 may be configured to include a second tri-state inverter TIV2, a fourth inverter IV4, and a fixed PMOS transistor P2. The fourth inverter IV4 inverts and then outputs the select signal sel. The second tri-state inverter TIV2 receives the second data fdata through an input terminal thereof, the select signal sel through an NMOS input terminal thereof, and the inverted signal of the select signal sel through a PMOS input terminal thereof.

The fixed PMOS transistor N2 is coupled between the output terminal of the second tri-state inverter TIV2 and the ground voltage and receives the select signal sel. In the second mode selection stage 211, if the select signal sel is activated to the high level, as the second tri-state inverter TIV2 is opened and the fixed PMOS transistor P2 is turned off, the second data fdata is inverted and then outputted as the second mode signal m2, and if the select signal sel is deactivated to the low level, as the second tri-state inverter TIV2 is closed and the fixed PMOS transistor P2 is turned on, the second mode signal m2 is outputted by being set to a low level.

As described above, the second delay stage 212 delays the second mode signal m2 and outputs the second delayed signal d2. The second delay stage 212 may be configured by a delay inverter DIV2 which is generally known in the art. A degree of the change in the pulse width of the pull-down drive signal pdn is determined depending upon a delay time of the second delay stage 212. Since the change in the pulse width of the pull-down drive signal pdn results in a change in the slew rate of the output signal out, the second delay stage 212 may be designed to delay the second mode signal m2 by a predetermined time or to variably delay the second mode signal m2 through a fuse option, etc.

The second pulse control stage 220 may be configured to include a combinational NOR gate NR1. The combinational NOR gate NR1 receives and NORs the second data fdata and the second delayed signal d2 and generate the pull-down pre-drive signal pdn. Due to a characteristic of a NORing operation, if the second delayed signal d2 has a low level, the combinational NOR gate NR1 inverts and outputs the second data fdata.

Accordingly, when the second delayed signal d2 has the low level, the second pulse control stage 220 generates and outputs the pull-down pre-drive signal pdn without controlling the pulse width of the second data fdata. If the select signal sel becomes the high level and the delayed signal of the second data fdata is inputted to the combinational NOR gate NR1 as the second delayed signal d2, the combinational NOR gate NR1 generates the pull-down pre-drive signal pdn through the NORing operation in a form in which a high level pulse width of the second data fdata is widened. At this time, the pulse width which is widened is changed depending upon a time for which the second delayed signal d2 is delayed compared to the second data fdata.

When the select signal sel is deactivated, the pull-up signal generation unit 100a and the pull-down signal generation unit 200a shown in FIG. 6 generate the pull-up pre-drive signal pup and the pull-down pre-drive signal pdn, respectively, without controlling the pulse widths of the first data rdata and the second data fdata. In this case, like the output driver according to the conventional art, the slew rate of the output signal out is determined by the driving forces of the pull-up pre-driver unit 300 and the pull-down pre-driver unit 400.

Conversely, when the select signal sel is activated, the pull-up signal generation unit 100a and the pull-down signal generation unit 200a generate the pull-up pre-drive signal pup and the pull-down pre-drive signal pdn by controlling the pulse widths of the first data rdata and the second data fdata. In this case, unlike the output driver according to the conventional art, the slew rate of the output signal out is determined by the pulse widths of the pull-up pre-drive signal pup and the pull-down pre-drive signal pdn. This feature can be advantageously used in a semiconductor apparatus developing procedure.

In a semiconductor apparatus developing procedure, a designed value and an after-production value of the slew rate of the output signal out may differ from each other. By checking the slew rate of the output signal out after production and setting the select signal sel to be activated or deactivated depending upon whether or not a checking result conforms to the designed value, it is possible to control the output signal out to have a desired slew rate.

Figure 7:
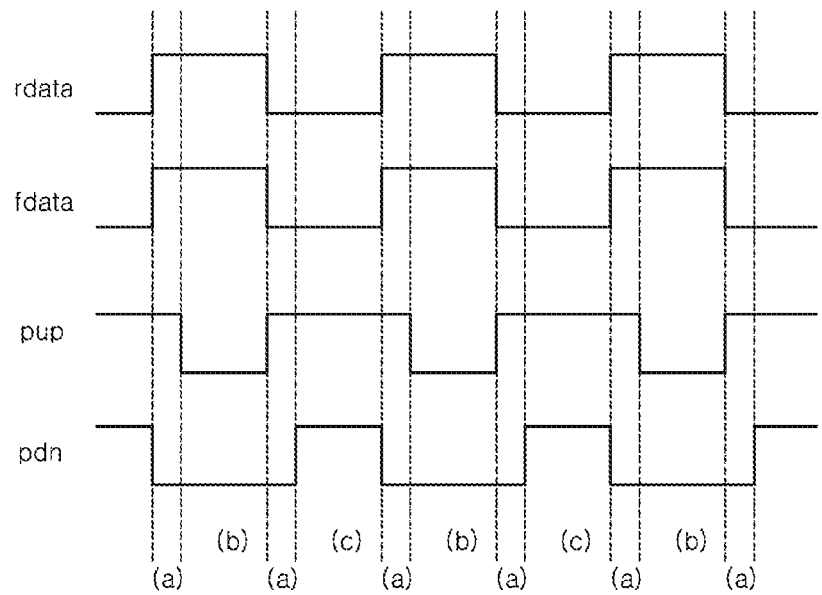
FIG. 7 is a waveform diagram showing the internal/external signals of the output driver shown in FIG. 6.

FIG. 7 is a waveform diagram showing the first data rdata and the second data fdata which are inputted to the output driver shown in FIG. 6 and the pull-up pre-drive signal pup and the pull-down pre-drive signal pdn which are generated by the pull-up signal generation unit 100a and the pull-down signal generation unit 200a.

When the select signal sel is activated, the pull-up pre-drive signal pup generated by the pull-up signal generation unit 100a has a form in which a high level pulse width of the first data rdata is narrowed and inverted. A size of the narrowed pulse width depends upon delay of the first delay stage 112.

When the select signal sel is activated, the pull-down pre-drive signal pdn generated by the pull-down signal generation unit 200a has a form in which a high level pulse width of the second data fdata is widened and inverted. A size of the widened pulse width depends upon delay of the second delay stage 212.

As a consequence, while the first data rdata and the second data fdata have the same voltage level and the same pulse width as described above, the pull-up pre-drive signal pup has a pulse width of a low logic value that is narrower than the first data rdata, and the pull-down pre-drive signal pdn has a pulse width of a low logic value that is wider than the second data fdata.

Thus, the pull-up pre-drive signal pup and the pull-down pre-drive signal pdn have periods which have different values. That is to say, there is a period (hereinafter, referred to as a "period (a)") in the waveform of FIG. 7, in which the pull-up pre-drive signal pup has a high level and the pull-down pre-drive signal pdn has a low level. In the period (a), the pull-up main driver unit 50a and the pull-down main driver unit 60a simultaneously charges and discharges the output node no, respectively.

A period (b) is defined as a period in which both of the pull-up pre-drive signal pup and the pull-down pre-drive signal pdn have low levels. In the period (b), the pull-up main driver unit 50a does not charge the output node no, and the pull-down main driver unit 60a discharges the output node no.

A period (c) is defined as a period in which both of the pull-up pre-drive signal pup and the pull-down pre-drive signal pdn have high levels. In the period (c), the pull-up main driver unit 50a charges the output node no, and the pull-down main driver unit 60a does not discharge the output node no. In this way, due to the fact that the period (a) for simultaneously charging and discharging the output node no is present between the period (b) for discharging the output node no and the period (c) for charging the output node no, the slew rate of the output signal out is controlled.

Figure 8:
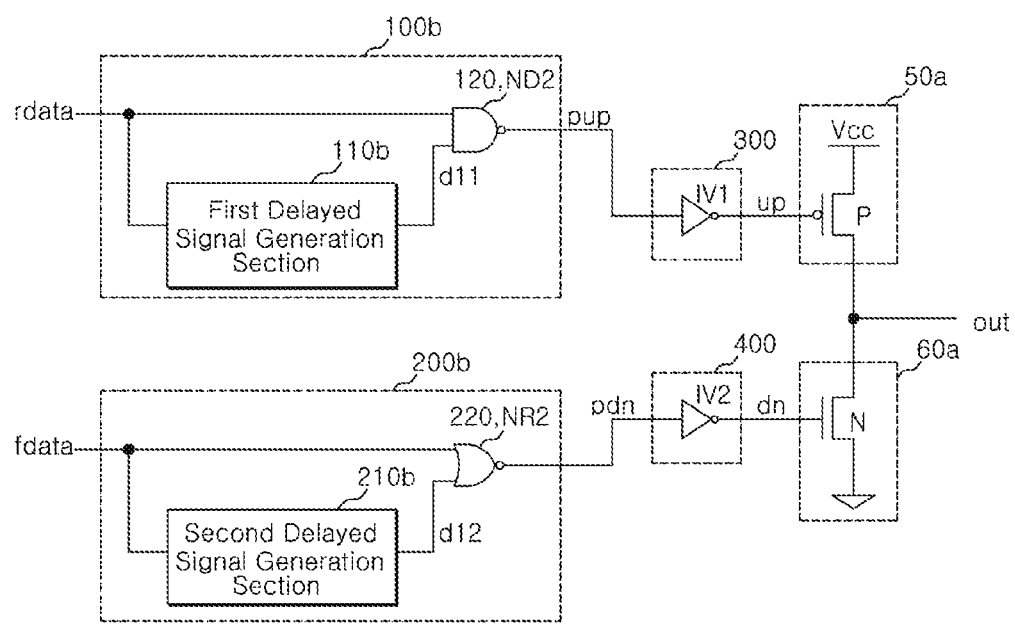
FIG. 8 is a circuit diagram illustrating an output driver in accordance with another embodiment of the present invention.

FIG. 8 is a circuit diagram illustrating an output driver in accordance with another embodiment of the present invention.

The output driver includes a pull-up signal generation unit 100b, a pull-down signal generation unit 200b, a pull-up pre-driver unit 300, a pull-down pre-driver unit 400, a pull-up main driver unit 50a, and a pull-down main driver unit 60a.

The pull-up signal generation unit 100b is configured to receive first data rdata, control a pulse width of the first data rdata, and output a pull-up pre-drive signal pup.

The pull-down signal generation unit 200b is configured to receive second data fdata, control a pulse width of the second data fdata, and output a pull-down pre-drive signal pdn.

The pull-up pre-driver unit 300 is configured to receive the pull-up pre-drive signal pup and generate a pull-up main drive signal up. The pull-up pre-driver unit 300 may be configured in the same way as the pull-up pre-driver unit 300 shown in FIG. 6.

The pull-down pre-driver unit 400 is configured to receive the pull-down pre-drive signal pdn and generate a pull-down main drive signal dn. The pull-down pre-driver unit 400 may be configured in the same way as the pull-down pre-driver unit 400 shown in FIG. 6.

The pull-up main driver unit 50a is configured to charge an output node no according to the pull-up main drive signal up. The pull-up main driver unit 50a may be configured in the same way as the pull-up main driver unit 50a shown in FIG. 6.

The pull-down main driver unit 60a is configured to discharge the output node no according to the pull-down main drive signal dn. The pull-down main driver unit 60a may be configured in the same way as the pull-down main driver unit 60a shown in FIG. 6.

The output driver shown in FIG. 8 operates in the same manner as the output driver shown in FIG. 5 operates when the select signal sel is activated in FIG. 5. The output driver generates the pull-up pre-drive signal pup and the pull-down pre-drive signal pdn by controlling pulse widths of the first data rdata and the second data fdata, and a slew rate of an output signal out is determined by the pulse widths of the pull-up pre-drive signal pup and the pull-down pre-drive signal pdn.

However, unlike the output driver shown in FIG. 5, the output driver shown in FIG. 8 does not receive the select signal sel. Unlike the output driver shown in FIG. 6 which generates the pull-up pre-drive signal pup and the pull-down pre-drive signal pdn by controlling or not controlling the pulse widths of the first data rdata and the second data fdata depending upon whether or not the select signal sel is activated, the output driver shown in FIG. 8 generates the pull-up pre-drive signal pup and the pull-down pre-drive signal pdn by controlling the pulse widths of the first data rdata and the second data fdata.

Due to the fact that the output driver shown in FIG. 8 generates the pull-up pre-drive signal pup and the pull-down pre-drive signal pdn by controlling the pulse widths of the first data rdata and the second data fdata, the output driver shown in FIG. 8 not only has a period in which one of a charging operation and a discharging operation is performed for the output node no, but also additionally has a period in which both of the charging operation and the discharging operation are simultaneously performed for the output node no. In the output driver in accordance with the present embodiment of the invention, the slew rate of the output signal out is determined by how long time the charging operation and the discharging operation are simultaneously performed for the output node no.

The pull-up signal generation unit 100b includes a first delayed signal generation section 110b and a first pulse control section 120.

The first delayed signal generation section 110b is configured to receive and delay the first data rdata and output a first delayed signal d11. The first delayed signal generation section 110b may be configured to include a delay circuit which is generally known in the art. In the output driver shown in FIG. 8, like the output driver shown in FIG. 6, since a pulse width change of the pull-up pre-drive signal pup is determined depending upon a delay time of the first delayed signal generation section 110b, the first delayed signal generation section 110b may be designed to delay the first data rdata by a predetermined time or to variably delay the first data rdata through a fuse option, etc.

The first pulse control section 120 is configured to receive the first data rdata and the first delayed signal d11 and generate the pull-up pre-drive signal pup. The first pulse control section 120 may be configured to include a combinational NAND gate ND2. Since the first delayed signal d11 is a signal which is generated by delaying the first data rdata, the pull-up pre-drive signal pup, which is generated by the first pulse control section 120 configured to include the combinational NAND gate ND2, has a form in which the pulse width of the first data rdata is narrowed. As described above, the pulse width of the pull-up pre-drive signal pup is changed depending upon a time for which the first delayed signal d11 is delayed from the first data rdata.

The pull-down signal generation unit 200b includes a second delayed signal generation section 210b and a second pulse control section 220.

The second delayed signal generation section 210b is configured to receive and delay the second data fdata and output a second delayed signal d12. The second delayed signal generation section 210b may be configured to include a delay circuit which is generally known in the art. Like the first delayed signal generation section 110b, the second delayed signal generation section 210b may be designed to delay the second data fdata by a predetermined time or to variably delay the second data fdata through a fuse option, etc.

The second pulse control section 220 is configured to receive the second data fdata and the second delayed signal d12 and generate the pull-down pre-drive signal pdn. The second pulse control section 220 may be configured to include a combinational NOR gate NR2. Since the second delayed signal d12 is a signal which is generated by delaying the second data fdata, the pull-down pre-drive signal pdn, which is generated by the second pulse control section 220 configured to include the combinational NOR gate NR2, has a form in which the pulse width of the second data fdata is widened. The pulse width of the pull-down pre-drive signal pdn is changed depending upon a time for which the second delayed signal d12 is delayed from the second data fdata.

The output driver shown in FIG. 8 operates in the same manner as the output drivers shown in FIGS. 5 and 6, except that a function of generating the pull-up pre-drive signal pup and the pull-down pre-drive signal pdn without controlling the pulse widths of the first data rdata and the second data fdata according to the select signal sel is omitted since the select signal sel is not received.

As described above, the slew rate of the output signal out is determined by how long time the pull-up driver unit 300 and the pull-down driver unit 400 simultaneously charges and discharges the output node no, and how long time the pull-up driver unit 300 and the pull-down driver unit 400 simultaneously charges and discharges the output node no is determined depending upon the pulse widths of the pull-up pre-drive signal pup and the pull-down pre-drive signal pdn.

As a consequence, the slew rate of the output signal out is determined by how long the first delayed signal generation section 110b and the second delayed signal generation section 210b respectively delay the first data rdata and the second data fdata. Accordingly, by configuring the first delayed signal generation section 110b and the second delayed signal generation section 210b to include delay circuits which can change delay times through fuse options, etc., it is possible to control the slew rate of the output signal out.

Figure 9:
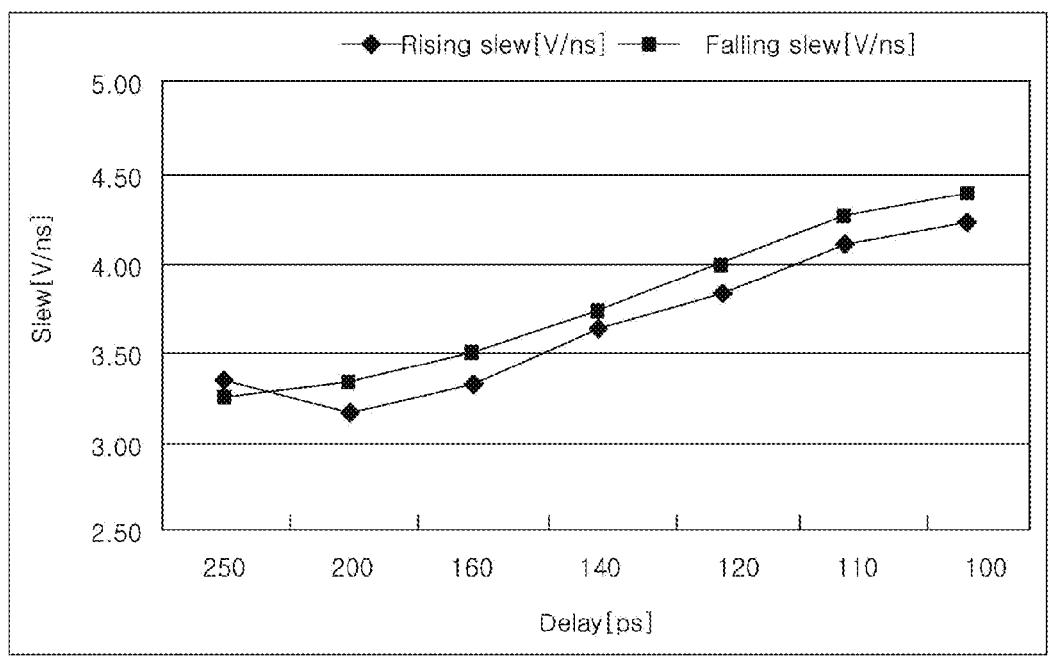
FIG. 9 is a graph showing slew rate simulation results of the output driver according to the present invention.

The graph shown in FIG. 9 illustrates simulation results in the case where, in the output driver shown in FIG. 6, the pull-up pre-drive signal pup and the pull-down pre-drive signal pdn are generated by activating the select signal sel and controlling the pulse widths of the first data rdata and the second data fdata. The graph can also be applied to the output driver shown in FIG. 8.

The graph shown in FIG. 9 illustrates slew rates of rising edges of the output signal out and slew rates of falling edges of the output signal out depending upon delay times of the first delay stage 112 and the second delay stage 212 of FIG. 6. Referring to FIG. 9, it can be seen that the slew rates of the rising edges of the output signal out and the slew rates of the falling edges of the output signal out generally decrease as the delay times of the first delay stage 112 and the second delay stage 212 increase. Namely, in the output driver according to the embodiment of the present invention, due to the fact that the pull-up pre-drive signal pup and the pull-down pre-drive signal pdn are generated by controlling the pulse widths of the first data rdata and the second data fdata, the slew rate of the output signal out can be controlled.

Figure 10:
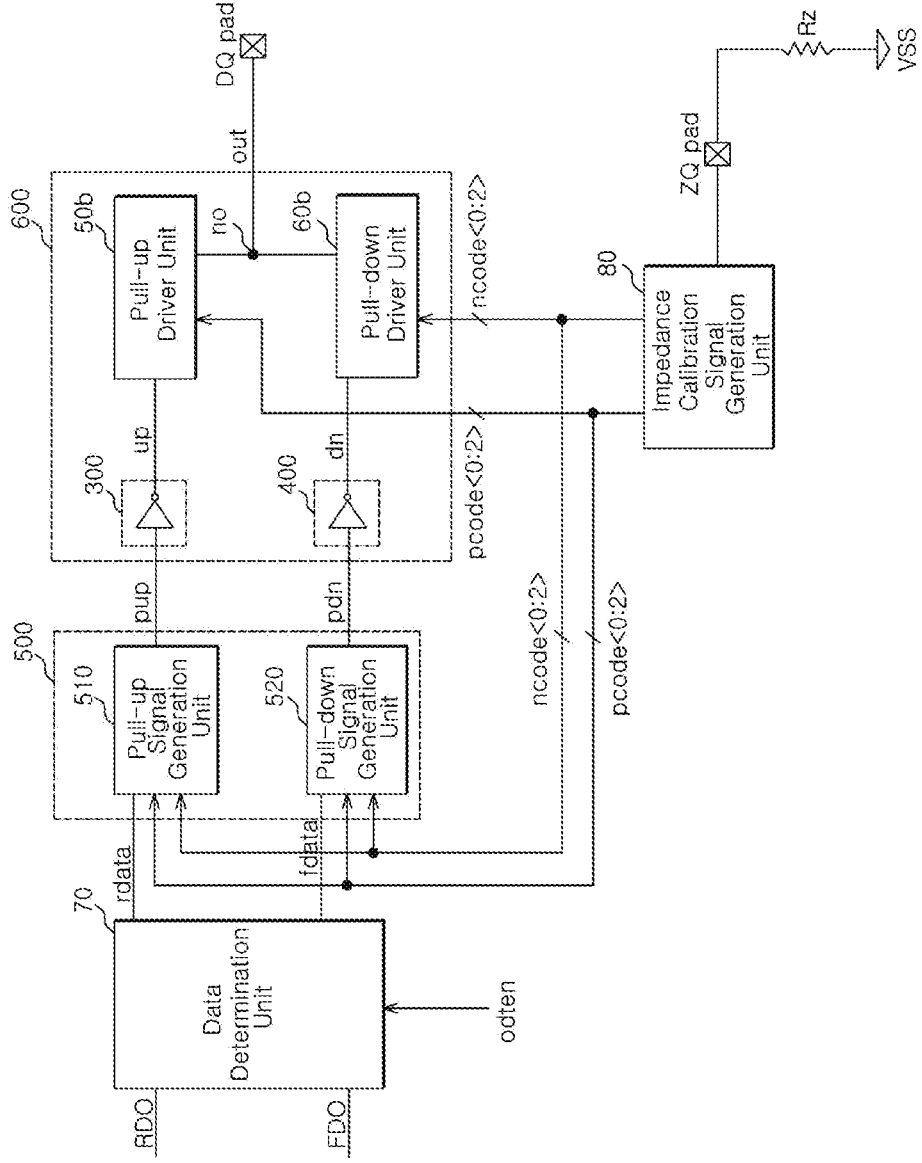
FIG. 10 is a block diagram illustrating the configuration of an output driver in accordance with another embodiment of the present invention.

FIG. 10 is a block diagram illustrating the configuration of an output driver in accordance with another embodiment of the present invention. The output driver may be configured to include a pulse width control block 500 and a driver block 600.

The pulse width control block 500 is configured to control a pulse width of first data rdata and output a pull-up pre-drive signal pup and to control a pulse width of second data fdata and output a pull-down pre-drive signal pdn, according to a first impedance calibration signal pcode<0:2> and a second impedance calibration signal ncode<0:2>. Degrees to which the pulse widths are controlled are changed depending upon the first impedance calibration signal pcode<0:2> and the second impedance calibration signal ncode<0:2>. In the output driver shown in FIG. 10, like the output drivers shown in FIGS. 5 and 8, a slew rate of an output signal out is determined by the degrees to which the pulse widths are controlled in the pulse width control block 500.

The driver block 600 is configured to drive an output node no in response to the pull-up pre-drive signal pup and the pull-down pre-drive signal pdn. The driver block 600 simultaneously charges and discharges the output node no for a predetermined time in a data output mode. The predetermined time for which the driver block 600 simultaneously charges and discharges the output node no depends on the degrees to which the pulse width control block 500 controls the pulse widths. As the output node no is charged and discharged by the driver block 600, the output signal out is generated. The output signal out is outputted through a DQ pad.

Referring to FIG. 10, the pulse width control block 500 may be configured to include a pull-up signal generation unit 510 and a pull-down signal generation unit 520. The pull-up signal generation unit 510 is configured to control the pulse width of the first data rdata according to the first impedance calibration signal pcode<0:2> and the second impedance calibration signal ncode<0:2>, respectively, and generate the pull-up pre-drive signal pup.

The pull-down signal generation unit 520 is configured to control the pulse width of the second data fdata according to the first impedance calibration signal pcode<0:2> and the second impedance calibration signal ncode<0:2>, respectively, and generate the pull-down pre-drive signal pdn. In order to enable the driver block 600 to charge and discharge the output node no for the predetermined time, the pull-up signal generation unit 510 may generate the pull-up pre-drive signal pup in such a manner that the driver block 600 can charge the output node no for a time longer than the pulse width of the first data rdata, and the pull-down signal generation unit 520 may generate the pull-down pre-drive signal pdn in such a manner that the driver block 600 can discharge the output node no for a time longer than the pulse width of the second data fdata.

The driver block 600 may perform an on-die termination operation by additionally receiving the first impedance calibration signal pcode<0:2> and the second impedance calibration signal ncode<0:2>. In an on-die termination mode, a charging current of the driver block 600 for the output node no is determined according to the first impedance calibration signal pcode<0:2>, and a discharging current of the driver block 600 for the output node no is determined according to the second impedance calibration signal ncode<0:2>. As shown in FIG. 10, the driver block 600 may be configured to include a pull-up driver unit 50b and a pull-down driver unit 60b. The pull-up driver unit 50b and the pull-down driver unit

Figure 3:
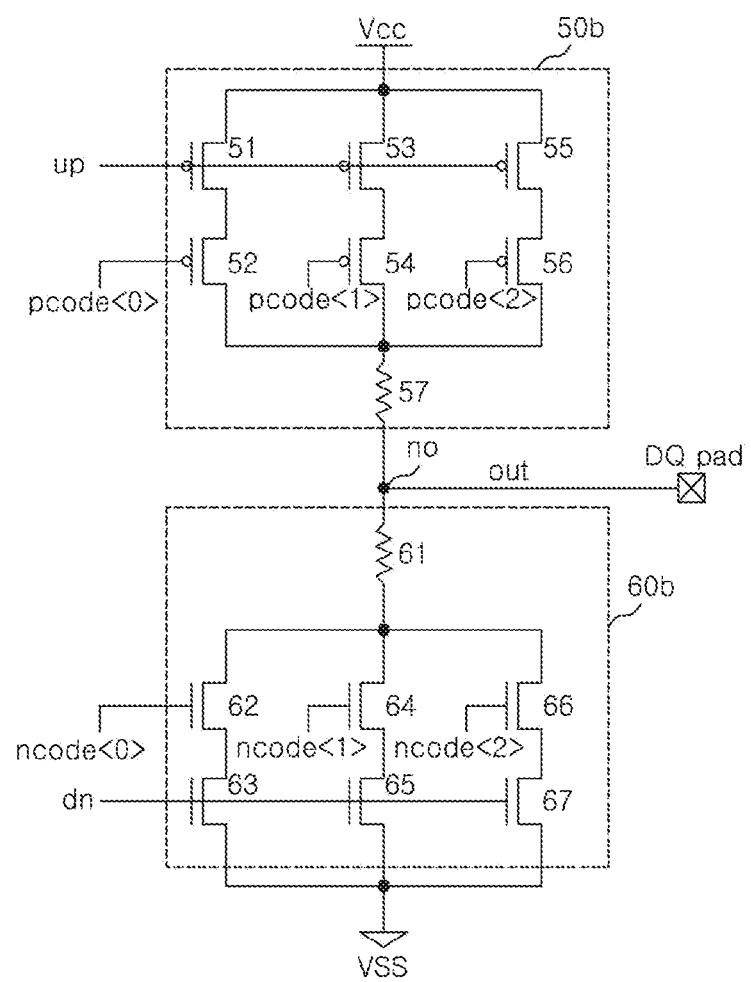
FIG. 3 is a circuit diagram illustrating the pull-up driver unit and the pull-down driver unit shown in FIG. 2.
Figure 4:
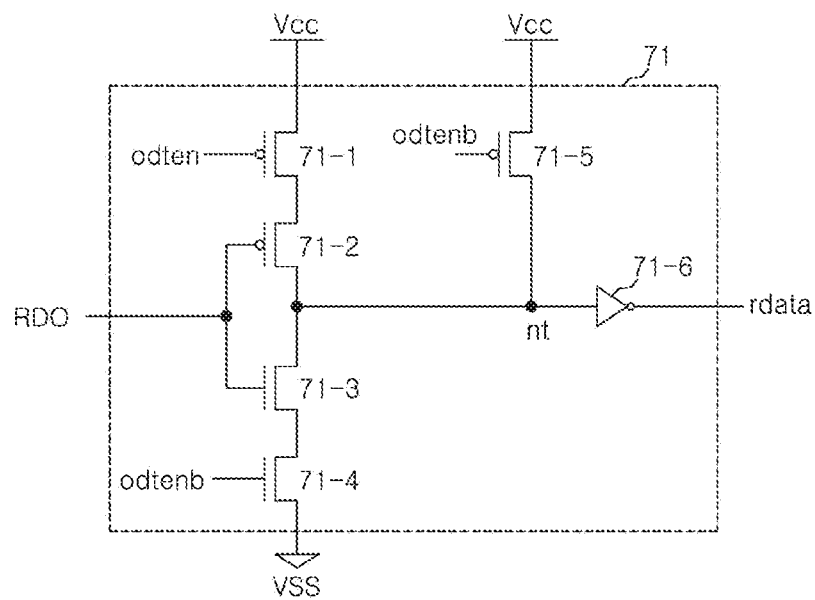
FIG. 4 is a circuit diagram illustrating the data determination unit shown in FIG. 2.
Figure 4:
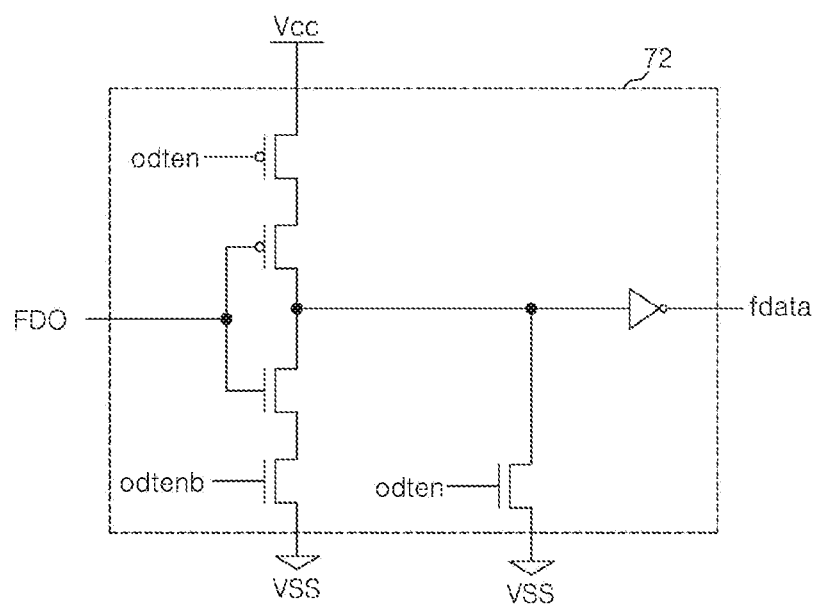

60*b* may be configured in the same way as the pull-up driver unit 50*b* and the pull-down driver unit 60*b* which are shown in FIG. 3.

Referring to FIG. 10, the driver block 600 may be configured to further include pre-driver units 300 and 400. The pre-driver units 300 and 400 are configured to receive the pull-up pre-drive signal pup and generate a pull-up main drive signal up and to receive the pull-down pre-drive signal pdn and generate a pull-down main drive signal dn. The pre-driver units 300 and 400 may be configured by a pull-up pre-driver unit 300 and a pull-down pre-driver unit 400. The pre-driver units 300 and 400 may be configured to include the pull-up pre-driver unit 300 and the pull-down pre-driver unit 400 shown in FIG. 5. As described above, the pull-up pre-driver unit 300 and the pull-down pre-driver unit 400 may be configured to have fixed driving forces since it is not necessary to change driving forces, unlike the conventional pull-up pre-driver unit 30 and pull-down pre-driver unit 40 shown in FIGS. 1 and 2.

Accordingly, the pre-driver units 300 and 400 need not receive other signals for controlling the slew rates of the pull-up main drive signal up and the pull-down main drive signal do except the pull-up pre-drive signal pup and the pull-down pre-drive signal pdn. Also, the pull-up pre-driver unit 300 and the pull-down pre-driver unit 400 need not include driving force controlling elements such as fuse options or need not be coupled to the driving force controlling elements so as to be controlled in driving forces thereof. However, when the pull-up pre-driver unit 300 and the pull-down driver unit 400 are configured to include the driving force controlling elements, the slew rate of the output signal out can be controlled in a precise manner.

Accordingly, it is to be understood that the configurations, shown in FIG. 10, of the pre-driver units 300 and 400 using inverters with constant driving forces are not essential to the embodiment of the present invention. Since the driving force controlling elements occupy a substantially large area in a semiconductor apparatus, and the output driver according to an embodiment of the present invention uses a method of controlling the pulse widths of the pull-up pre-drive signal pup and the pull-down pre-drive signal pdn so as to control the slew rate of the output signal out, the pre-driver units 300 and 400 may be configured not to include the driving force controlling elements such as the fuse options, so as to ensure efficient use of the area of the semiconductor apparatus.

As mentioned above, in the data output mode, the pull-up driver unit 50*b* and the pull-down driver unit 60*b* of the conventional output driver shown in FIG. 3 alternately charge and discharge the output node no. Speaking in detail, in a period in which the pull-up driver unit 50*b* is activated and charges the output node no, the pull-down driver unit 60*b* is deactivated and does not discharge the output node no. Conversely, in a period in which the pull-down driver unit 60*b* is activated and discharges the output node no, the pull-up driver unit 50*b* is deactivated and does not charge the output node no.

Unlike this, in the data output mode, the output driver in accordance with the embodiment of the present invention not only has a period in which one of a charging operation and a discharging operation is performed for the output node no, but also additionally has a period in which both of the charging operation and the discharging operation are simultaneously performed for the output node no. The slew rate of the output signal out is decreased in this period when the charging operation and the discharging operation are simultaneously performed for the output node no.

Also, as the period, in which the charging operation and the discharging operation are simultaneously performed for the output node no, is lengthened compared to the period, in which one of the charging operation and the discharging operation is performed for the output node no, the slew rate of the output signal out is further decreased. Using this principle, in the output driver in accordance with the embodiment of the present invention, by controlling the period in which the charging operation and the discharging operation are simultaneously performed for the output node no, the slew rate of the output signal out can be controlled.

The additional provision of the period in which the charging operation and the discharging operation are simultaneously performed for the output node no may be implemented by generating the pull-up pre-drive signal pup and the pull-down pre-drive signal pdn through controlling the pulse widths of the first data rdata and the second data fdata. Further, since degrees to which the pulse widths are controlled are changed depending upon the first impedance calibration signal pcode<0:2> and the second impedance calibration signal ncode<0:2>, the slew rate controlled by the output driver according to the embodiment of the present invention can compensate for PVT variation.

The first data rdata and the second data fdata used in the data output mode to output data are signals which have the same voltage level and the same timing, that is, signals which have the same signal value. The conventional output driver shown in FIG. 2 receives the first data rdata and the second data fdata which have the same signal value, generates the pull-up pre-drive signal pup and the pull-down pre-drive signal pdn which have the same signal value, and generates the pull-up main drive signal up and the pull-down main drive signal dn which have the same signal value.

As shown in FIG. 2, since the pull-up driver unit 50*b* is configured to include a PMOS transistor group and the pull-down driver unit 60*b* is configured to include an NMOS transistor group, the pull-up driver unit 50*b* and the pull-down driver unit 60*b*, which are activated by receiving the pull-up main drive signal up and the pull-down main drive signal dn, respectively, are activated alternately with each other. In other words, in the data output mode, the pull-up main drive signal up and the pull-down main drive signal dn according to the conventional art are not simultaneously activated.

Unlike this, in the output driver in accordance with the embodiment of the present invention, since the pull-up pre-drive signal pup and the pull-down pre-drive signal pdn are generated by controlling the pulse widths of the first data rdata and the second data fdata, even in the data output mode, the output driver has the period in which the pull-up driver unit 50*b* and the pull-down driver unit 60*b* are simultaneously activated and the output node no is simultaneously charged and discharged.

Here, the period in which the output node no is simultaneously charged and discharged is maintained for the predetermined time between the periods in which the output node no is alternately charged and discharged. The operations, in which the output driver in accordance with the embodiment of the present invention simultaneously charges and discharges the output node no in the data output mode, are not continuously maintained unlike the on-die termination operation which is maintained for the period of the on-die termination mode, and instead, are maintained for the predetermined time between the periods in which the output node no is alternately charged and discharged, as shown in the waveform of FIG. 7.

Moreover, the period in which the output node no is simultaneously charged and discharged in the data output mode is controlled depending upon the pulse widths of the pull-up pre-drive signal pup and the pull-down pre-drive signal pdn, and degrees to which the pulse widths of the pull-up pre-drive signal pup and the pull-down pre-drive signal pdn are controlled are changed depending upon the first impedance calibration signal pcode<0:2> and the second impedance calibration signal ncode<0:2>, respectively.

Accordingly, a difference in the pulse widths of the pull-up pre-drive signal pup and the pull-down pre-drive signal pdn is changed depending upon the first and second impedance calibration signals pcode<0:2> and ncode<0:2>, respectively, and thus, the slew rate of the output signal out is changed too.

In the output driver in accordance with the embodiment of the present invention, due to the fact that the pull-up pre-drive signal pup and the pull-down pre-drive signal pdn are generated by controlling the pulse widths of the first data rdata and the second data fdata and the slew rate of the output signal out is controlled through the pull-up pre-drive signal pup and the pull-down pre-drive signal pdn, the problems occurring in the conventional output driver can be alleviated.

As stated above, in the conventional output driver shown in FIG. 2, the slew rate of the output signal out markedly changes according to PVT variation. In order to compensate for a slew rate change, the conventional output driver adopts a method of controlling the slew rates of the pull-up and pull-down main drive signals up and dn. Nevertheless, in this method, since the slew rates of the pull-up and pull-down main drive signals up and dn are excessively small, the pull-up and pull-down main drive signals up and dn may not make full swings from a power supply voltage level to a ground voltage level, and accordingly, a jitter may be caused due to ISI, which may lead to deterioration of a timing characteristic of the output signal out and occurrence of a skew between data pads DQs.

In the output driver in accordance with an embodiment of the present invention, since the slew rate of the output signal out is controlled not by controlling the slew rates of the pull-up and pull-down main drive signals up and dn, but by controlling the pulse widths of the pull-up pre-drive signal pup and the pull-down pre-drive signal pdn, it is possible to prevent problems from being caused due to the fact that the slew rates of the pull-up and pull-down main drive signals up and dn are set to be excessively low and an ISI jitter occurs. Furthermore, because the pulse widths are controlled according to the first and second impedance calibration signals pcode<0:2> and ncode<0:2>, it is possible to compensate for a slew rate change due to PVT variation.

In addition, referring to FIG. 10, the output driver in accordance with an embodiment of the present invention, which includes the pulse width control block 500 and the driver block 600, may be configured to further include a data determination unit 70 and an impedance calibration signal generation unit 80. The data determination unit 70 and the impedance calibration signal generation unit 80 may be configured in the same way as the data determination unit 70 and the impedance calibration signal generation unit 80 according to the conventional art. Accordingly, detailed descriptions of the data determination unit 70 and the impedance calibration signal generation unit 80 will be omitted herein.

Figure 11:
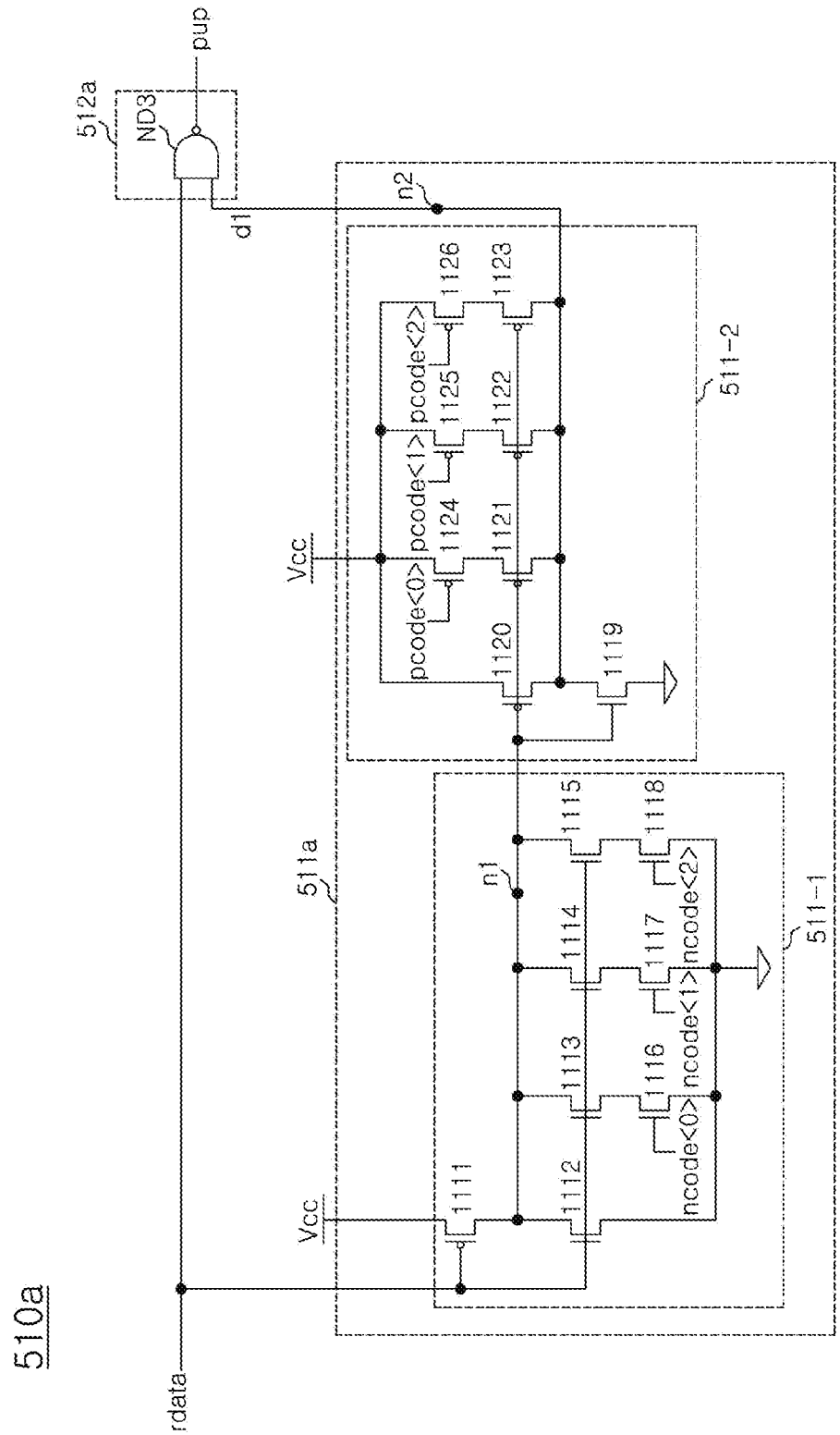
FIG. 11 is a circuit diagram illustrating one embodiment of the pull-up signal generation unit shown in FIG. 10.

FIG. 11 is a circuit diagram illustrating one embodiment 510a of the pull-up signal generation unit 510 shown in FIG. 10.

As mentioned above, the pull-up signal generation unit 510a is configured to control the pulse width of the first data rdata according to the first impedance calibration signal pcode<0:2> and the second impedance calibration signal ncode<0:2> and output the pull-up pre-drive signal pup. The pull-up signal generation unit 510a may be configured to include a first delayed signal generation section 511a and a first pulse control section 512a. The pull-up signal generation unit 510a shown in FIG. 11 generates a first delayed signal d1 through the first delayed signal generation section 511a and NANDs the first data rdata and the first delayed signal d1 through the first pulse control section 512a. Due to this fact, the pull-up signal generation unit 510a can generate the pull-up pre-drive signal pup in a form in which the pulse width of the first data rdata is controlled.

The first pulse control section 512a is configured to receive the first data rdata and the first delayed signal d1 and generate the pull-up pre-drive signal pup. As shown in FIG. 11, the first pulse control section 512a may be configured to include a first NAND gate ND3 which receives the first data rdata and the first delayed signal d1.

The first delayed signal generation section 511a is configured to variably delay the first data rdata according to the first impedance calibration signal pcode<0:2> and the second impedance calibration signal ncode<0:2> and generate the first delayed signal d1. Referring to FIG. 11, the first delayed signal generation section 511a is constituted by a serial combination of two variable delay inverters 511-1 and 511-2.

The first variable delay inverter 511-1 is configured to variably delay the first data rdata according to the second impedance calibration signal ncode<0:2> and change a level of a first node n1. The second variable delay inverter 511-2 is configured to receive a voltage of the first node n1, variably delay the voltage of the first node n1 according to the first impedance calibration signal pcode<0:2> and output the first delayed signal d1 to a second node n2.

In FIG. 11, the first variable delay inverter 511-1 is configured to include a first PMOS transistor 1111, a first NMOS transistor 1112, first through third control NMOS transistors 1113 through 1115, and first through third enable NMOS transistors 1116 through 1118. The first PMOS transistor 1111 is coupled between a terminal of a power supply voltage Vcc and the first node n1 and receives the first data rdata. The first NMOS transistor 1112 is coupled between the first node n1 and a ground terminal and receives the first data rdata.

The first through third control NMOS transistors 1113 through 1115 have drain terminals which are commonly coupled to the first node n1, and are respectively coupled in series with the first through third enable NMOS transistors 1116 through 1118. The first through third control NMOS transistors 1113 through 1115 commonly receive the first data rdata. The first through third enable NMOS transistors 1116 through 1118 have source terminals which are commonly coupled to the ground terminal, and receive respective bits of the second impedance calibration signal ncode <0:2>.

That is to say, the first through third enable NMOS transistors 1116 through 1118 are activated according to the respective bits of the second impedance calibration signal ncode<0:2> and serve as current sink paths of the first through third control NMOS transistors 1113 through 1115. Which transistor among the first through third enable NMOS transistors 1116 through 1118 will be turned on is determined according to the second impedance calibration signal ncode<0:2>.

If the first data rdata is inputted at a high level, the first NMOS transistor 1112 is activated and discharges the first node n1, and the first through third control NMOS transistors 1113 through 1115, which are coupled in series with the first through third enable NMOS transistors 1116 through 1118 turned on according to the second impedance calibration signal ncode<0:2> and serving as the current sink paths, additionally discharge the first node n1. Since a discharge speed of the first node n1 is changed depending upon a turnedon or turned-off state of the first through third control NMOS transistors 1113 through 1115, a voltage level change speed of the first node n1 is changed depending upon the second impedance calibration signal ncode<0:2>.

Namely, the first variable delay inverter 511-1 variably delays and inverts the first data rdata according to the second impedance calibration signal ncode<0:2> and outputs a resultant signal to the first node n1. The second variable delay inverter 511-2 is configured to include a second NMOS transistors 1119, a second PMOS transistor 1120, first through third control PMOS transistors 1121 through 1123, and first through third enable PMOS transistors 1124 through 1126. The second NMOS transistor 1119 is coupled between the second node n2 and the ground terminal and receives a voltage of the first node n1. The second PMOS transistor 1120 is coupled between the terminal of the power supply voltage Vcc and the second node n2 and receives the voltage of the first node n1.

The first through third control PMOS transistors 1121 through 1123 have drain terminals which are commonly coupled to the second node n2, and are respectively coupled in series with the first through third enable PMOS transistors 1124 through 1126. The first through third control PMOS transistors 1121 through 1123 commonly receive the voltage of the first node n1. The first through third enable PMOS transistors 1124 through 1126 have source terminals which are commonly coupled to the terminal of the power supply voltage Vcc, and receive respective bits of the first impedance calibration signal pcode<0:2>.

Namely, the first through third enable PMOS transistors 1124 through 1126 are activated according to the first impedance calibration signal pcode<0:2> and supply power to the first through third control PMOS transistors 1121 through 1123, respectively. In other words, the second variable delay inverter 511-2 variably delays and inverts the voltage of the first node n1 according to the first impedance calibration signal pcode<0:2> and outputs the first delayed signal d1 to the second node n2. According to the operations of the first variable delay inverter 511-1 and the second variable delay inverter 511-2 which are coupled in series, the first delayed signal d1 is a signal which is generated by variably delaying the first data rdata according to the first impedance calibration signal pcode<0:2>.

In FIG. 11, a configuration is illustrated, in which the first and second variable delay inverters 511-1 and 511-2 include the first through third enable NMOS transistors 1116 through 1118 receiving the second impedance calibration signal ncode<0:2> of 3 bits, and three transistors, that is, the first through third enable PMOS transistors receiving the first impedance calibration signal pcode<0:2> of 3 bits. While the first impedance calibration signal pcode<0:2> and the second impedance calibration signal ncode<0:2> are exemplified as 3-bit signals for the sake of convenience in explanation, it is to be noted that the bit number of the first impedance calibration signal pcode<0:2> and the second impedance calibration signal ncode<0:2> can be differently set. Also, it is conceivable depending upon a design of a person skilled in the art that it is possible to generate control signals which have a bit number smaller than n, by combining the impedance calibration signals.

As described above, while the first impedance calibration signal pcode<0:2> and the second impedance calibration signal ncode<0:2> are exemplified as 3-bit signals for the sake of convenience in explanation, it is apparent that it is not intended to specifically limit the bit number of the first impedance calibration signal pcode<0:2> and the second impedance calibration signal ncode<0:2>. If each of the first and second variable delay inverters 511-1 and 511-2 shown in FIG. 11 is constituted by a single inverter which is generally known in the art, a delay time thereof is changed depending upon a PVT variation.

In the case of FIG. 11 in which the transistors to be turned on or off according to the first impedance calibration signal pcode<0:2> and the second impedance calibration signal ncode<0:2>, respectively, are disposed in parallel, a relatively large number of transistors are turned on among the transistors disposed in parallel under a condition in which a delay time is lengthened according to a PVT variation, in such a way as to shorten the delay time, and a relatively small number of transistors are turned on among the transistors disposed in parallel under a condition in which a delay time is shortened according to a PVT variation, in such a way as to lengthen the delay time, whereby it is possible to compensate for a delay time in conformity with a PVT variation.

Referring to the circuit diagram of FIG. 11, it is illustrated that the first variable delay inverter 511-1 is configured by coupling in parallel NMOS transistors for discharging the first node n1, and the second variable delay inverter 511-2 is configured by coupling in parallel PMOS transistors for charging the second node n2. Also, a PMOS transistor for charging the first node n1 is configured to include only the first PMOS transistors 1111, and an NMOS transistor for discharging the second node n2 is configured to include only the second NMOS transistors 1119. This is because a configuration is made to realize the waveform of the pull-up pre-drive signal pup generated by the pull-up signal generation unit 510*a*.

As can be seen from the waveform shown in FIG. 7, the pull-up pre-drive signal pup has a form in which the first data rdata is narrowed in the pulse width thereof and is inverted. Because the first pulse control section 512*a* NANDs the first data rdata and the first delayed signal d1 and generates the pull-up pre-drive signal pup, a timing of the rising edge of the first delayed signal d1 determines the pulse width of the pull-up pre-drive signal pup.

The configurations of the first variable delay inverter 511-1 and the second variable delay inverter 511-2 shown in FIG. 11 and described above are to determine the timing of the rising edge of the first delayed signal d1 according to the first impedance calibration signal pcode<0:2> and the second impedance calibration signal ncode<0:2>. Since the falling edge of the first delayed signal d1 does not exert any influence on the waveform of the pull-up pre-drive signal pup, the first PMOS transistor 1111 for charging the first node n1 and the second NMOS transistor 1119 for discharging the second node n2 need not be configured by parallel combinations of transistors which receive the first impedance calibration signal pcode<0:2> and the second impedance calibration signal ncode<0:2>. Accordingly, single transistors such as the first PMOS transistor 1111 and the second NMOS transistor 1119 may be used to increase areal efficiency.

Depending upon how long the first variable delay inverter 511-1 and the second variable delay inverter 511-2 delay the rising edge of the first data rdata to generate the first delayed signal d1, the predetermined time for which the driver block 600 simultaneously charges and discharges the output node no is changed. A time for which the first delayed signal generation section 511*a* shown in FIG. 11 delays the rising edge of the first data rdata is determined such that the driver block 600 charges the output node no for a time longer than the pulse width of the first data rdata, and a time for which a second delayed signal generation section 521 to be illustrated in FIG. 12 delays the falling edge of the second data fdata is determined such that the driver block 600 discharges the output node no for a time longer than the pulse width of the second data fdata.

Figure 12:
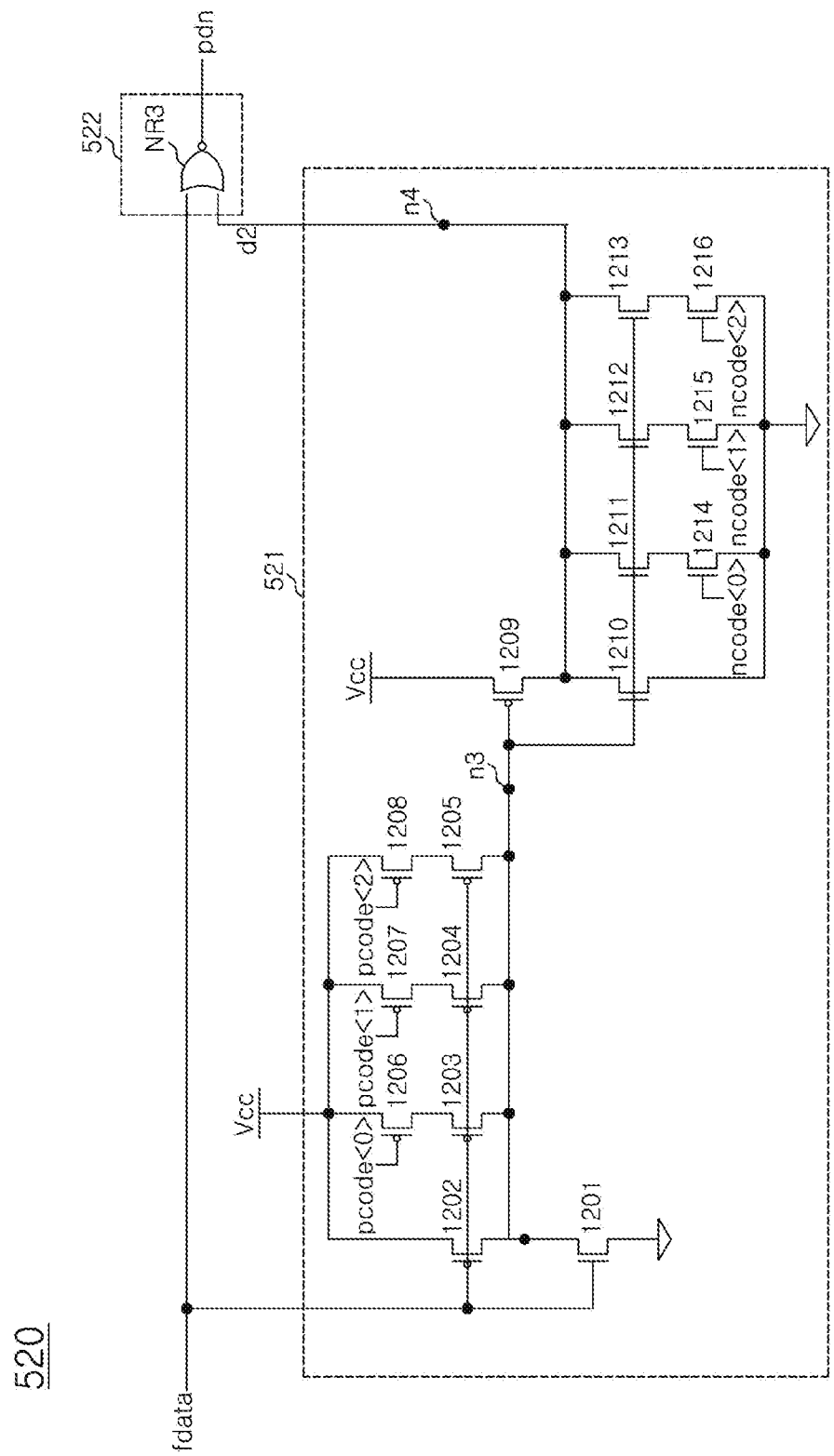
FIG. 12 is a circuit diagram illustrating one embodiment of the pull-down signal generation unit shown in FIG. 10.

Accordingly, the sum of the time, for which the first delayed signal generation section 511*a* shown in FIG. 11 delays the rising edge of the first data rdata, and the time, for which the second delayed signal generation section 521 to be illustrated in FIG. 12 delays the falling edge of the second data fdata, corresponds to the predetermined time.

FIG. 12 is a circuit diagram illustrating one embodiment of the pull-down signal generation unit 520 shown in FIG. 10. As described above, the pull-down signal generation unit 520 controls the pulse width of the second data fdata according to the first impedance calibration signal pcode<0:2> and the second impedance calibration signal ncode<0:2> and outputs the pull-down pre-drive signal pdn. The pull-down signal generation unit 520 may be configured to include the second delayed signal generation section 521 and a second pulse control section 522. The pull-down signal generation unit 520 shown in FIG. 12 is configured to generate a second delayed signal d2 through the second delayed signal generation section 521 and generate the pull-down pre-drive signal pdn by NORing the second data fdata and the second delayed signal d2 through the second pulse control section 522.

The second pulse control section 522 is configured to receive the second data fdata and the second delayed signal d2 and generate the pull-down pre-drive signal pdn. In FIG. 12, the second pulse control section 522 may be configured to include a first NOR gate NR3 which receives the second data fdata and the second delayed signal d2.

The second delayed signal generation section 521 is configured to delay the second data fdata according to the first impedance calibration signal pcode<0:2> and the second impedance calibration signal ncode<0:2> and output the second delayed signal d2. The second delayed signal generation section 521 is exemplarily illustrated to have a configuration similar to the first delayed signal generation section 511*a*.

The second delayed signal generation section 521 is configured by a combination of two variable delay inverters, like the first delayed signal generation section 511*a*. As shown in the waveform diagram of FIG. 7, the second delayed signal generation section 521 generates the pull-down pre-drive signal pdn by controlling the pulse width of the second data fdata to be widened, unlike the first delayed signal generation section 511*a*. That is to say, the second delayed signal generation section 521 is configured to determine a timing of the falling edge of the second delayed signal d2. Since the configuration and the operating principle of the second delayed signal generation section 521 are symmetrical and similar to the configuration and the operating principle of the first delayed signal generation section 511*a*, detailed descriptions thereof will be omitted herein.

Figure 13:
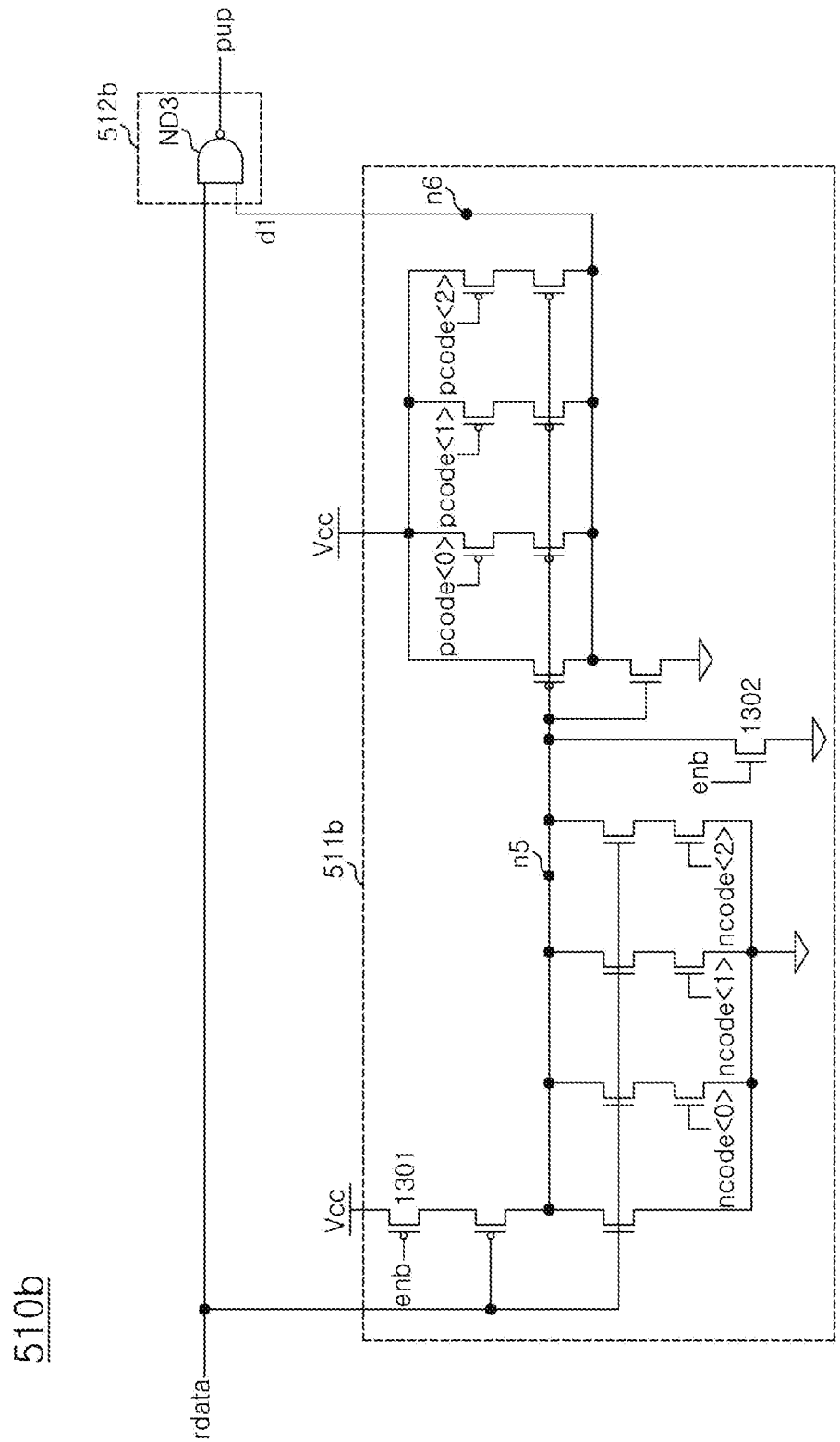
FIG. 13 is a circuit diagram illustrating another embodiment of the pull-up signal generation unit shown in FIG. 10.

FIG. 13 is a circuit diagram illustrating another embodiment 510*b* of the pull-up signal generation unit 510 shown in FIG. 10. Unlike the pull-up signal generation unit 510*a* shown in FIG. 11, in the pull-up signal generation unit 510*b* shown in FIG. 13, a first delayed signal generation section 511*b* additionally includes two transistors 1301 and 1302 which receive a delay enable signal enb. The delay enable signal enb is a low active signal and may be configured using a test mode signal. Like the pull-up signal generation unit 510*a* shown in FIG. 11, the pull-up signal generation unit 510*b* shown in FIG. 13 controls the pulse width of the first data rdata according to the first impedance calibration signal pcode <0:2> and the second impedance calibration signal ncode <0:2> and outputs the pull-up pre-drive signal pup when the delay enable signal enb is activated.

However, unlike the pull-up signal generation unit 510*a* shown in FIG. 11, the pull-up signal generation unit 510*b* shown in FIG. 13 outputs the pull-up pre-drive signal pup without controlling the pulse width of the first data rdata when the delay enable signal enb is deactivated. Unlike the first delayed signal generation section 511*a* shown in FIG. 11, the first delayed signal generation section 511*b* shown in FIG. 13 additionally includes the two transistors 1301 and 1302 which receive the delay enable signal enb.

The first delayed signal generation section 511*b* further includes a switching PMOS transistor 1301 which is disposed between the first PMOS transistor of the first delayed signal generation section 511*a* and the terminal of the power supply voltage Vcc and receives the delay enable signal enb. Also, the first delayed signal generation section 511*b* further includes a switching NMOS transistor 1302 which is disposed between a fifth node n5 corresponding to the first node n1 of the first delayed signal generation section 511*a* shown in FIG. 11 and the ground terminal and receives the delay enable signal enb. If the delay enable signal enb is activated, as the switching PMOS transistor 1301 is turned on and the switching NMOS transistor 1302 is turned off, the first delayed signal generation section 511*b* operates like the first delayed signal generation section 511*a*.

Conversely, if the delay enable signal enb is deactivated, as the switching PMOS transistor 1301 is turned off and the switching NMOS transistor 1302 is turned on, the first delay signal generation section 511*b* changes a voltage of a sixth node n6 to a low level, that is, fixes the first delayed signal d1 to the low level. Since the first delayed signal d1 is inputted to the first NAND gate ND3, due to a characteristic of a NANDing operation, the first NAND gate ND3 which receives the first delayed signal d1 of the low level operates as an inverter.

Accordingly, the pull-up pre-drive signal pup becomes a signal which has the same pulse width as the first data rdata. Due to the fact that the first delayed signal generation section 511*b* additionally receives the delay enable signal enb unlike the first delayed signal generation section 511*a*, the operation of the pull-up signal generation unit 510*b* for controlling a pulse width can be activated/deactivated. By configuring the pull-down signal generation unit 520 such that the second delayed signal generation section 521 additionally receives the delay enable signal enb like the first delayed signal generation section 511*b* shown in FIG. 13, the operation of the pull-down signal generation unit 520 for controlling a pulse width can be activated/deactivated.

In the output driver in accordance with the embodiment of the present invention shown in FIGS. 10 through 13, unlike the conventional output driver, the slew rate of the output signal out is controlled by controlling the pulse widths of the pull-up pre-drive signal pup and the pull-down pre-drive signal pdn, and the pulse widths are changed in response to the first impedance calibration signal pcode<0:2> and the second impedance calibration signal ncode<0:2>, whereby a slew rate can be substantially insensitive to a PVT variation.

Figure 14A:
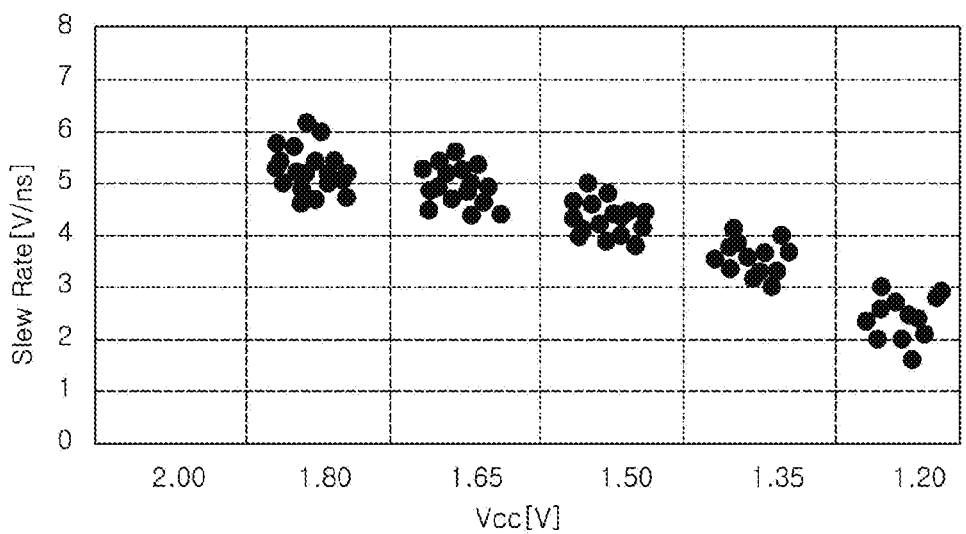
FIG. 14A is a graph showing simulation results for the relationship between PVT variation and slew rate in the output driver according to the conventional art.
Figure 14B:
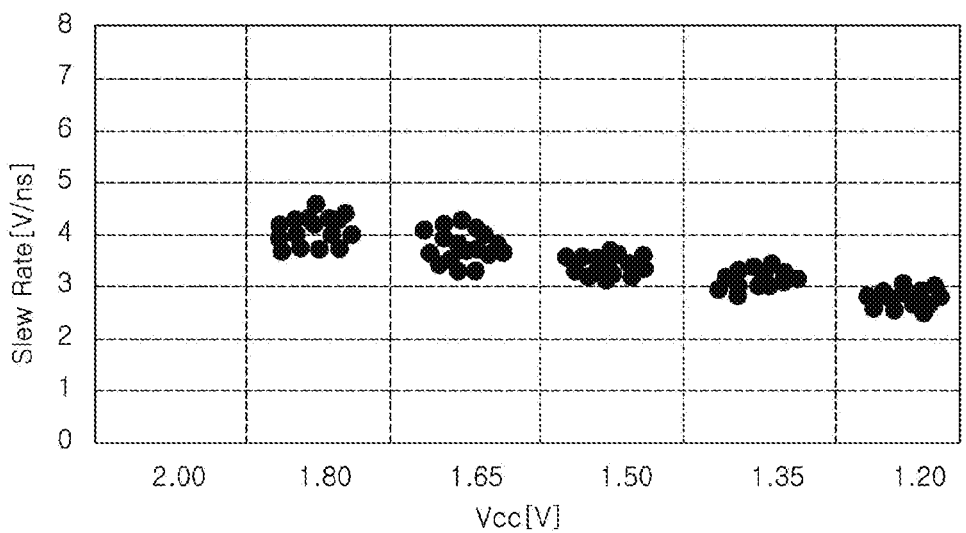
FIG. 14B is a graph showing that the output driver according to the embodiment of the present invention has a slew rate characteristic insensitive to PVT variation.

FIG. 14A is a graph showing simulation results for the relationship between a PVT variation and a slew rate in the output driver according to the conventional art, and FIG. 14B is a graph showing that the output driver according to the embodiment of the present invention has a slew rate characteristic insensitive to a PVT variation. The groups of points shown in FIGS. 14A and 14B represent resultant values of slew rates that are calculated when the power supply voltage Vcc is fixed stepwise (to 2.00V, 1.80V, 1.65V, 1.50V, 1.35V and 1.20V) and process and temperature are varied.

Referring to FIGS. 14A and 14B, when observing a slope of slew rates that are changed with a change in the power supply voltage Vcc due to voltage variation, it can be seen that a slope of slew rates is slower in FIG. 14B than FIG. 14A. That is to say, in the output driver according to the embodiments of the present invention, a slew rate change due to voltage variation is less than for the output driver according to the conventional art.

Further, referring to FIGS. 14A and 14B, when observing distribution of a slew rate that versus process and temperature variations, it can be seen that distribution is less spread out in FIG. 14B than FIG. 14A. That is to say, in the output driver according to the embodiments of the present invention, a slew rate change due to process and temperature variations is less than for the output driver according to the conventional art.

While certain embodiments have been described above, it will be understood to those skilled in the art that the embodiments described are by way of example only. Accordingly, the output driver and the semiconductor apparatus having the same described herein should not be limited based on the described embodiments. Rather, the output driver and the semiconductor apparatus having the same described herein should only be limited in light of the claims that follow when taken in conjunction with the above description and accompanying drawings.

What is claimed is:

1. A semiconductor apparatus comprising:
a pulse width control block configured to control a pulse width of first data and output a pull-up pre-drive signal and to control a pulse width of second data and output a pull-down pre-drive signal, according to a first impedance calibration signal and a second impedance calibration signal; and
a driver block configured to drive an output node in response to the pull-up pre-drive signal, the pull-down pre-drive signal, the first impedance calibration signal and the second impedance calibration signal,
wherein the pulse width control block comprises:
a delayed signal generation section configured to variably delay the first data and output a first delayed signal and to variably delay the second data and output a second delayed signal, according to the first impedance calibration signal and the second impedance calibration signal; and
a pulse control section configured to receive the first data and the first delayed signal and generate the pull-up pre-drive signal and to receive the second data and the second delayed signal and generate the pull-down pre-drive signal.

2. The semiconductor apparatus according to claim 1, wherein the driver block simultaneously charges and discharges the output node for a predetermined time in a data output mode.

3. The semiconductor apparatus according to claim 2,
wherein the driver block charges the output node in response to the pull-up pre-drive signal and discharges the output node in response to the pull-down pre-drive signal, and
wherein the predetermined time corresponds to the pulse widths of the first data and the second data.

4. The semiconductor apparatus according to claim 1, wherein the delayed signal generation section generates the first delayed signal by delaying a rising edge of the first data and generates the second delayed signal by delaying a falling edge of the second data.

5. The semiconductor apparatus according to claim 1, wherein the delayed signal generation section generates the first delayed signal by delaying a falling edge of the first data and generates the second delayed signal by delaying a rising edge of the second data.

6. The semiconductor apparatus according to claim 1, wherein the delayed signal generation section includes a PMOS transistor which receives the first impedance calibration signal and an NMOS transistor which receives the second impedance calibration signal.

7. The semiconductor apparatus according to claim 6, wherein the delayed signal generation section includes a first variable delay inverter which receives the first impedance calibration signal and a second variable delay inverter which receives the second impedance calibration signal.

8. The semiconductor apparatus according to claim 1, wherein a delay enable signal is used to control the pulse widths of the first data and the second data.

9. The semiconductor apparatus according to claim 1, wherein, in the driver block, a charge current for the output node in an on-die termination mode is determined according to the first impedance calibration signal, and a discharge current for the output node in the on-die termination mode is determined according to the second impedance calibration signal.

10. The semiconductor apparatus according to claim 1, further comprising:
a data determination unit configured to generate the first data and the second data in response to a first source signal, a second source signal, and an ODT enable signal.

11. The semiconductor apparatus according to claim 10,
wherein the data determination unit outputs the first source signal as the first data and the second source signal as the second data when the ODT enable signal is deasserted, and
wherein the data determination unit generates the first data and the second data such that a pull-up driver unit and a pull-down driver unit perform an on-die termination operation when the ODT enable signal is asserted.

12. The semiconductor apparatus according to claim 11, wherein the ODT enable signal is asserted in the on-die termination mode and is deasserted in the data output mode.

13. The semiconductor apparatus according to claim 1, further comprising:
an impedance calibration signal generation unit configured to generate the first and second impedance calibration signals based on an impedance value of an external resistor coupled to a ZQ pad.

14. A semiconductor apparatus comprising:
a pulse width control block configured to control a pulse width of first data and output a pull-up pre-drive signal and to control a pulse width of second data and output a pull-down pre-drive signal, according to a first impedance calibration signal and a second impedance calibration signal; and
a driver block configured to drive an output node in response to the pull-up pre-drive signal, the pull-down pre-drive signal, the first impedance calibration signal and the second impedance calibration signal,
wherein the pulse width control block comprises:
a pull-up signal generation unit configured to control the pulse width of the first data according to the first impedance calibration signal and the second impedance calibration signal and output the pull-up pre-drive signal; and
a pull-down signal generation unit configured to control the pulse width of the second data according to the first impedance calibration signal and the second impedance calibration signal and output the pull-down pre-drive signal, wherein the pull-up signal generation unit generates the pull-up pre-drive signal such that the driver block charges the output node for a time longer than the pulse width of the first data, and wherein the pull-down signal generation unit generates the pull-down pre-drive signal such that the driver block discharges the output node for a time longer than the pulse width of the second data.

15. A semiconductor apparatus comprising:

a pulse width control block configured to control a pulse width of first data and output a pull-up pre-drive signal and to control a pulse width of second data and output a pull-down pre-drive signal, according to a first impedance calibration signal and a second impedance calibration signal; and a driver block configured to drive an output node in response to the pull-up pre-drive signal, the pull-down pre-drive signal, the first impedance calibration signal and the second impedance calibration signal, wherein the driver block comprises:

a pre-driver unit configured to receive the pull-up pre-drive signal and generate a pull-up main drive signal and to receive the pull-down pre-drive signal and generate a pull-down main drive signal; and a main driver unit configured to charge the output node in response to the pull-up main drive signal and to discharge the output node in response to the pull-down main drive signal.

16. The semiconductor apparatus according to claim 15, wherein the pre-driver unit has a fixed driving force with respect to the pull-up main drive signal and the pull-down main drive signal.

* * * * *